United States Patent
Song et al.

(10) Patent No.: US 8,145,979 B2
(45) Date of Patent: Mar. 27, 2012

(54) DTV TRANSMITTING SYSTEM AND RECEIVING SYSTEM AND METHOD OF PROCESSING TELEVISION SIGNAL

(75) Inventors: Won Gyu Song, Seoul (KR); In Hwan Choi, Gyeonggi-do (KR); Kook Yeon Kwak, Gyeonggi-do (KR); Byoung Gill Kim, Seoul (KR); Jin Woo Kim, Seoul (KR); Hyoung Gon Lee, Seoul (KR); Jong Moon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/078,854

(22) Filed: Apr. 1, 2011

(65) Prior Publication Data

US 2011/0176061 A1     Jul. 21, 2011

Related U.S. Application Data

(63) Continuation of application No. 11/766,020, filed on Jun. 20, 2007, now Pat. No. 7,934,145.

(60) Provisional application No. 60/884,001, filed on Jan. 8, 2007.

(30) Foreign Application Priority Data

Jun. 20, 2006  (KR) .................. 10-2006-0055508
Sep. 15, 2006  (KR) .................. 10-2006-0089736

(51) Int. Cl.
*H03M 13/00* (2006.01)
(52) U.S. Cl. ....................... 714/776; 714/755
(58) Field of Classification Search .................. 714/776, 714/755
See application file for complete search history.

(56) References Cited

U.S. PATENT DOCUMENTS

| | | | | |
|---|---|---|---|---|
| 4,888,767 | A * | 12/1989 | Furuya et al. ................. | 370/243 |
| 6,178,179 | B1 | 1/2001 | Phillips et al. | |
| 6,320,879 | B1 * | 11/2001 | Bremer ......................... | 370/493 |
| 6,404,861 | B1 * | 6/2002 | Cohen et al. ............... | 379/93.01 |
| 2001/0039636 | A1 * | 11/2001 | Hammons et al. ........... | 714/752 |
| 2002/0154709 | A1 | 10/2002 | Choi et al. | |
| 2002/0186790 | A1 | 12/2002 | Choi et al. | |
| 2004/0090997 | A1 | 5/2004 | Choi et al. | |
| 2005/0271158 | A1 | 12/2005 | Birru | |

FOREIGN PATENT DOCUMENTS

| | | |
|---|---|---|
| WO | 2005-006759 | 1/2005 |
| WO | 2005-115001 | 12/2005 |
| WO | 2005-120062 | 12/2005 |

* cited by examiner

*Primary Examiner* — M. Mujtaba K Chaudry
(74) *Attorney, Agent, or Firm* — Lee, Hong, Degerman, Kang & Waimey

(57) ABSTRACT

A digital television transmitting system includes a pre-processor, a packet generator, an RS encoder, and a trellis encoder. The pre-processor pre-processes enhanced data by coding the enhanced data for first forward error correction (FEC) and expanding the FEC-coded enhanced data. The packet generator generates first and second enhanced data packets including the pre-processed enhanced data and main data packets and multiplexes the enhanced and main data packets. The first enhanced data packet includes an adaptation field including the pre-processed enhanced data and second enhanced data packet includes a payload region including the pre-processed enhanced data. The RS encoder performs RS encoding on the multiplexed data packets for second forward error correction (FEC), and the trellis encoder performs trellis encoding on the RS-coded data packets.

8 Claims, 14 Drawing Sheets

DTV TRANSMITTING SYSTEM AND RECEIVING SYSTEM AND METHOD OF PROCESSING TELEVISION SIGNAL

CROSS-REFERENCE TO RELATED APPLICATIONS

This application is a continuation of U.S. patent application Ser. No. 11/766,020, filed on Jun. 20, 2007, now U.S. Pat. No. 7,934,145, which claims the benefit of earlier filing date and right of priority to Korean Patent Application Nos. 10-2006-0055508, filed on Jun. 20, 2006 and 10-2006-0089736, filed on Sep. 15, 2006, and also claims the benefit of U.S. Provisional Patent Application Ser. No. 60/884,001, filed on Jan. 8, 2007, the contents of which are all hereby incorporated by reference herein in their entirety.

BACKGROUND OF THE INVENTION

1. Field of the Invention

The present invention relates to digital television (DTV) systems and methods of processing television signals.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitting system and a DTV receiving system and a method of processing television signal that substantially obviate one or more problems due to limitations and disadvantages of the related art.

An object of the present invention is to provide a digital television (DTV) transmitting system and a DTV receiving system and a method of processing television signal that is suitable for transmitting supplemental data and that is highly resistant to noise.

Another object of the present invention is to provide a digital television (DTV) transmitting system and a DTV receiving system and a method of processing television signal that can transmit additional data to provide compatibility with the conventional receiving system (or receiver).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes a pre-processor, a packet generator, a Reed-Solomon (RS) encoder, and a trellis decoder. The pre-processor pre-processes enhanced data by coding the enhanced data for first forward error correction (FEC) and expanding the FEC-coded enhanced data. The packet generator generates first and second enhanced data packets including the pre-processed enhanced data and main data packets including main data, and it multiplexes the enhanced and main data packets according to a predetermined multiplexing rule. The first enhanced data packet includes an adaptation field including the pre-processed enhanced data, and the second enhanced data packet includes a payload region including the pre-processed enhanced data. The RS encoder performs RS encoding on the multiplexed main and enhanced data packets for second forward error correction (FEC). The trellis encoder performs trellis encoding on the RS-coded main and enhanced data packets.

In another aspect of the present invention, a digital television (DTV) receiving system includes a tuner, a demodulator, an equalizer, a block decoder, a Reed-Solomon (RS) decoder, a data deformatter, and a data processor. The tuner tunes to a channel to receive a digital television signal. The demodulator demodulates the digital television signal, and the equalizer performs channel equalization on the demodulated signal. The block decoder performs trellis-decoding on main and first and second enhanced data packets included in the channel-equalized signal. The first enhanced data packet includes a first MPEG header and an adaptation field including first enhanced data, and the second enhanced data packet includes a second MPEG header and a payload region including second enhanced data packet. The RS decoder performs RS decoding on the trellis-decoded main and enhanced data packets for first forward error correction (FEC). The data deformatter deformats the RS-decoded enhanced data packets by removing the first and second MPEG headers and by outputting the first and second enhanced data only. The data processor removes null data included in the deformatted first and second enhanced data and decodes the null-data-removed enhanced data for second forward error correction (FEC).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiver. Furthermore, the main data consist of data that can be received from the conventional receiving system, wherein the main data include video/audio data. The present invention relates to transmitting enhanced data or known data so as to enhance the receiving performance of the digital broadcast receiving system and to maintain compatibility with the conventional receiving system.

Generally, a transport stream (TS) packet has a fixed length of 188 bytes. The transport stream (TS) packet broadly consists of a header and a payload. Herein, the header corresponds to an information area, and the payload corresponds to a data area. At this point, depending upon whether or not an adaptation field is included in the TS packet, the payload has a variable length within the range of to 184 bytes. If an adaptation field is not included in the TS packet, the payload of the TS packet is fixed to 184 bytes.

Figure 1:
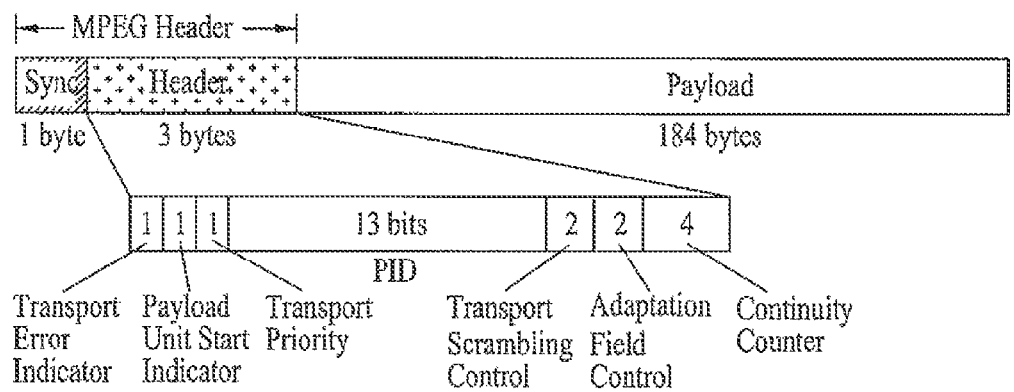
FIG. 1 illustrates a structure of a transport stream packet that does not include an adaptation field.

FIG. 1 illustrates a structure of a transport stream (TS) packet that does not include an adaptation field. Herein, the TS packet consists of a 4-byte MPEG header and a 184-byte payload. Among the 4 bytes of the MPEG header, 1 byte corresponds to a synchronization data byte. In case of a MPEG-2 type, the synchronization data byte is assigned with a value of 0x47(=0100 0111). Among the remaining 3 bytes of the MPEG header includes a 1-bit transport error indicator field, a 1-bit payload unit start indicator field, a 1-bit transport priority field, a 13-bit PID field, a 2-bit transport scrambling control field, a 2-bit adaptation field control field, and a 4-bit continuity counter field. Herein, the adaptation field control field indicates whether or not the adaptation field is included in the TS packet.

More specifically, referring to FIG. 1, when an error or problem has occurred in a transport layer portion (e.g., when a packet is lost), a value '1' is indicated in the transport error indicator field. The payload unit start indicator field indicates a starting point (or beginning) of a packet. When the field value of the payload unit start indicator field is '1', a TS unit header is included in the packet, and a payload size may be obtained by using the TS unit header so as to combine the packet. In other words, when the value of the payload unit start indicator field is equal to '1', this indicates that the TS packet corresponds to a first (or beginning) portion of the packetized elementary stream (PES) packet. When a plurality of TS packets is grouped to form a PBS packet, the TS packet having the payload unit start indicator field value of '1' is detected, then by using a continuity of a continuity counter field value to find (or detect) the subsequent TS packet. Thereafter, the two detected TS packets are combined so as to create (or generate) a PBS packet. If the payload unit start indicator field value is equal to '0', this indicates that the TS packet correspond to a mid-portion or end portion of the PBS packet and not the beginning portion.

The transport priority field decides a transport priority of a transmitting medium, when two or more transmitting media having the same PID exist on a TS transmission path. The TS packet having the value '1' of this field is entitled to a higher priority. The PID field is an identifier for identifying the corresponding packet. For example, when the PID value is '0', the corresponding packet is identified as a PAT. The transport scrambling control field indicates whether the corresponding TS packet has been scrambled or not.

The adaptation field control field indicates whether the corresponding packet includes an adaptation field or not. For example, if the value of the adaptation field control field is equal to '10' or '11', this indicates that the corresponding TS packet includes an adaptation field. More specifically, when the field value is '10', a payload area does not exist within the corresponding TS packet. When the field value is '11', this indicates that the length of the payload area may vary in accordance with the length of the adaptation field. Conversely, when the adaptation field control value is '01', this indicates that the adaptation field is not included in the corresponding TS packet. Furthermore, '00' is not used as the value for the adaptation field control value. The continuity counter field is used for TS packets having the same RID, wherein the value increases by 1 for each TS packet. However, when the adaptation field control value is equal to '00' or '10', the value of the continuity counter field must not be increased.

Figure 2:
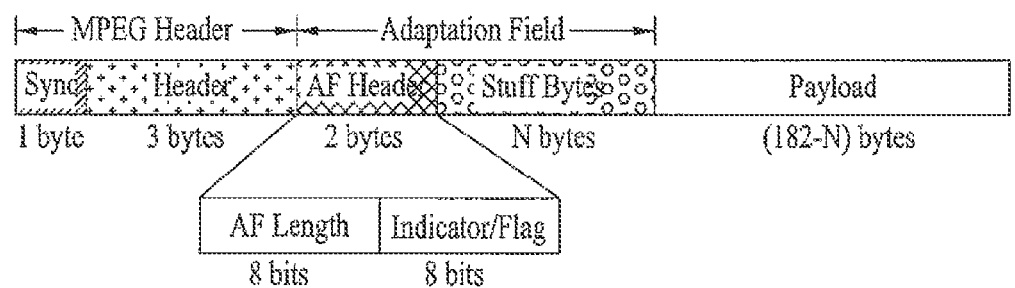
FIG. 2 illustrates a structure of a transport stream packet that includes an adaptation field.

FIG. 2 illustrates a structure of a TS packet including an adaptation field. This structure corresponds to the structure of the TS packet shown in FIG. 1 further including the adaptation field. The adaptation field consists of a 2-byte AF header and an N-byte stuff byte. The AF header is allocated with an 8-bit AF length field and an 8-bit indicator flag field. The AF header indicates the length of the adaptation field. More specifically, when the corresponding TS packet includes an adaptation field, the length of the payload within the TS packet is equal to 182-N (wherein N is equal to a stuff byte length). For example, if the length of the stuff byte within the corresponding TS packet is equal to 182, the payload length does not exist. On the other hand, if the length of the stuff byte is equal to 20, the payload length is equal to 162. Hereinafter, in the description of the present invention, a TS packet that does not include any adaptation field in its structure will be referred to as a first TS packet (or first data format), and a TS packet including an adaptation field in its structure will be referred to as a second TS packet (or second data format), for simplicity. Herein, the second TS packet consists of a data area that is divided into an adaptation field area and a payload area.

The present invention relates to insert enhanced data and/or known data into the payload area within the first TS packet and transmit the processed data, or to insert enhanced data and/or known data into the stuff byte area within the second TS packet and transmit the processed data. If enhanced data and/or known data are inserted into the payload area within the first TS packet and then transmitted, the enhanced and/or known data and the main data are identified by the PID value within the MPEG header. More specifically, the enhanced data and/or known data use all of the 184-byte payload area within a single TS packet. Similarly, the main data also use all of the 184-byte payload area within a single TS packet. In other words, the enhanced data (or known data) and the main data are not mixed within a TS packet.

Meanwhile, if enhanced data and/or known data are inserted into the payload area within the second TS packet and then transmitted, the enhanced and/or known data and the main data are identified by an adaptation field control value within the MPEG header. At this point, a payload area may or may not exist within the second TS packet depending upon a length of the data being inserted in the adaptation field area. If the length of the data being inserted in the adaptation field area is smaller than 182 bytes, a payload area is included in the second TS packet. In this case, the main data may be inserted in the payload area. More specifically, if the TS packet corresponds to the second TS packet, the enhanced data (or known data) and the main data may be multiplexed within the TS packet.

Hereinafter, in the description of the present invention, a first TS packet created (or generated) by inserting the enhanced data and/or known data in the payload area that is identified by the PID value will be referred to as a first enhanced data packet. And, a second TS packet created (or generated) by inserting the enhanced data and/or known data in the adaptation field area that is identified by the adaptation field control value will be referred to as a second enhanced data packet. Furthermore, a first TS packet created (or generated) by inserting the main data in the payload area that is identified by the PID value will be referred to as a main data packet.

Figure 3:
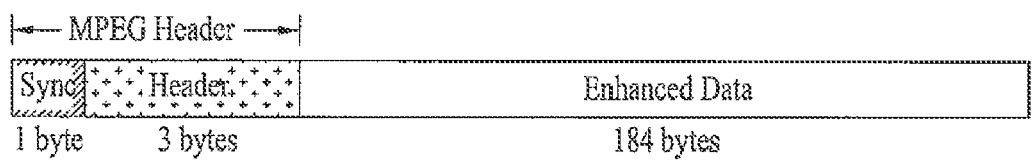
FIG. 3 illustrates a structure of a transport stream packet according to an embodiment of the present invention.
Figure 4:
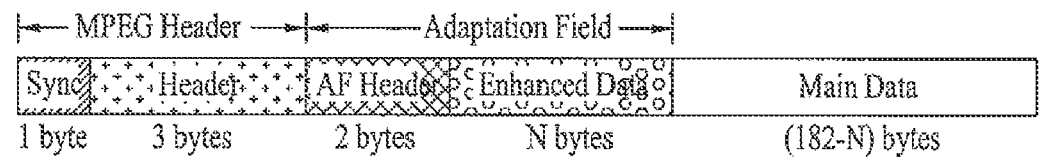
FIG. 4 illustrates a structure of a transport stream packet according to another embodiment of the present invention.

FIG. 3 illustrates a structure of a first enhanced data packet according to the present invention. In this example, the adaptation field area does not exist in the data area, and enhanced data are inserted in the payload area. FIG. 4 illustrates a structure of a second enhanced data packet according to the present invention. In this example, the data area is divided into an adaptation field and a payload area. Herein, enhanced data are inserted in the adaptation field, and main data are inserted in the payload area.

Figure 5:
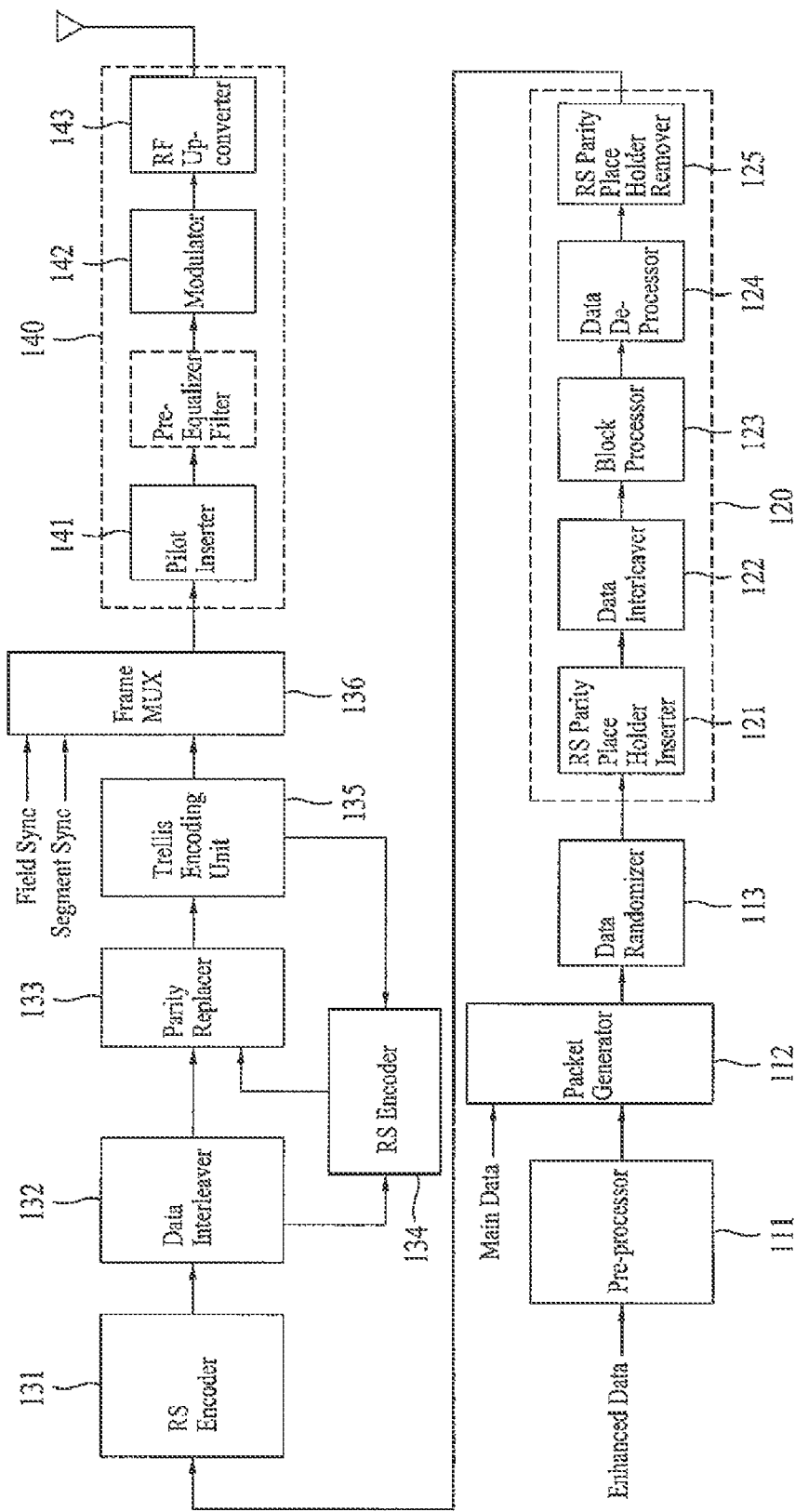
FIG. 5 illustrates a block diagram of a digital broadcast transmitting system according to an embodiment of the present invention.

FIG. 5 illustrates a block diagram of a digital broadcast transmitting system for transmitting enhanced data and known data according to an embodiment of the present invention. Referring to FIG. 5, the digital broadcast transmitting system includes a pre-processor 111, a packet generator 112, a data randomizer 113, a post-processor 120, a RS encoder 132, a parity replacer 133, a RS encoder 134, a trellis encoder 135, a frame multiplexer 136, and a transmitting unit 140. In the present invention having the above-described structure, the pre-processor performs additional error correction encoding process, interleaving process, and null data insertion process for byte expansion on the enhanced data that are being inputted. In addition, known data (or known data place holders) having a pre-decided pattern may be inserted in the pre-processor 111. At this point, an initialization data place holder for initializing the trellis encoder 135 may be inserted in the pre-processor 111. The data being outputted from the pre-processor 111 are inputted to the packet generator 112. Herein, the data outputted from the pre-processor 111 includes at least one type of the enhanced data, the known data place holders (or known data), and the initialization data place holders.

The packet generator 112 inserts a 4-byte MPEG header byte and, if required, a 2-byte adaptation field header in the main data and the data being outputted from the pre-processor 111 so as to configure a 188-byte unit TS packet. More specifically, the packet generator 112 receives the main data and the data being outputted from the pre-processor 111, so as to create (or generate) a 188-byte enhanced data packet and a 188-byte main data packet. Herein, the enhanced data packet may have the same structure as either the first enhanced data packet of FIG. 3 or the second enhanced data packet of FIG. 4. At this point, whether to generate a first enhanced data packet or to generate a second enhanced data packet may be decided based upon the data type, the multiplexing rule, or the characteristic of each data group, which will be described in a later process. More specifically, a transmission frame may include only the first enhanced data packets, only the second data packets, or both first and second enhanced data packets. Herein, the main data may or may not be included in the transmission frame.

The 188-byte first enhanced data packet includes a 4-byte MPEG header and a 184-byte payload area. At least one type of the enhanced data, the known data place holders (or known data), and the initialization data place holders are included in the payload area. Alternatively, the 188-byte second enhanced data packet includes a 4-byte MPEG header, a (2+N)-byte adaptation field (wherein N corresponds to a stuff byte size), and a (182-N)-byte payload area. Herein, at least one type of the enhanced data, the known data place holders (or known data), and the initialization data place holders are inserted in the stuff byte area within the adaptation field. Also, main data are inserted in the payload area.

When the packet generator 112 inserts the data, which are outputted from the pre-processor 111, in the stuff byte area within the adaptation field so as to generate the second enhanced data packet, the AF header within the adaptation field indicates the length of the data that are inserted in the corresponding stuff byte area. Depending upon whether or not the payload area is included, the adaptation field control value within the AF header respectively indicates one of the values '10' and '11'. Also, the packet generator 112 may generate main data packets configured only of main data. The main data packet has the same structure as that of the first enhanced data packet. The only difference is that the main data are inserted in the payload area instead of the enhanced data (or known data).

Depending upon the system design of the present invention, the process of the pre-processor 111 inserting the known data place holders (or known data) and the initialization data place holders in the enhanced data is omitted. Alternatively, this process may be performed by the packet generator 112. The first and second enhanced data packets, and the main data packet outputted from the packet generator 112 are multiplexed in packet units and inputted to the data randomizer 113. The data randomizer 113 discards the MPEG synchronization byte from the data packet being inputted thereto and randomizes the remaining 187 bytes by using a pseudo random byte generated from the data randomizer 113. Then, the randomized data are outputted to the post-processor 120.

The post-processor 120 includes a RS parity place holder inserter 121, a data interleaver 122, a block processor 123, a data deinterleaver 124, and a RS parity place holder remover 125. The RS parity place holder inserter 121 of the post-processor 120 performs a systematic RS parity place holder insertion process, when the 187-byte unit data packet being outputted from the data randomizer 113 corresponds to a main data packet. More specifically, the RS parity place holder inserter 121 inserts 20 bytes of RS parity place holders at the end of the 187-byte main data packet, thereby outputting the 207-byte main data packet to the data interleaver 122. Meanwhile, the RS parity place holder inserter 121 performs either a systematic RS parity place holder insertion process or a non-systematic RS parity place holder insertion process, when the 187-byte unit data packet being outputted from the data randomizer 113 corresponds to an enhanced data packet.

At this point, when the RS parity place holder inserter 121 performs non-systematic RS parity place holder insertion on the enhanced data packet, 20 bytes of RS parity place holders are inserted in pre-defined places within the packet for a non-systematic RS encoding process, which is to be performed in a later process. Also, the bytes within the enhanced data packet are serially inserted in respective places of the remaining 187 bytes. Herein, it is preferable to decide arbitrary places that are outputted later than the initialization data place holders among the 207 bytes within one data packet, which is inputted to the data interleaver 122 or 132, as the pre-defined RS parity place holder.

Further, it is even more preferable to perform a non-systematic RS parity place holder insertion process on an enhanced data packet, which does not include a single set of main data. The RS parity place holder inserter 121 may perform systematic or non-systematic RS encoding instead of systematic or non-systematic RS parity place holder insertion so as to insert systematic RS parity or non-systematic RS parity. The 207-byte enhanced data packet or main data packet that is outputted from the RS parity place holder inserter 121 is interleaved by the data interleaver 122 and, then, inputted to the block processor 123.

The block processor 123 performs additional encoding only on the enhanced data that are outputted from the data interleaver 122. For example, if the pre-processor 111 expanded the enhanced data from 1 byte to 2 bytes, then the block processor 123 performs an encoding processed at a 1/2-coding rate. Alternatively, if the pre-processor 111 expanded the enhanced data from 1 byte to 4 bytes, then the block processor 123 performs an encoding processed at a 1/4-coding rate. Also, the main data or the RS parity place holders (or RS parity data) bypass the block processor 123 without being processed with additional encoding. In other words, the main data or the RS parity place holders (or RS parity data) are directly outputted without any data modification. Moreover, the 3-byte MPEG header and the 2-byte adaptation field header are also directly outputted without any data modification. Furthermore, the known data place holders (or known data) and the initialization data place holders are also directly outputted without any data modification. At this point, the known data place holder may be replaced with the known data generated from the block processor 123 and, then, outputted. Herein, the data being encoded and replaced by the block processor 123 and bypassing block processor 123 are inputted to the data deinterleaver 124. The data deinterleaver 124 performs an inverse process of the data interleaver 122 by deinterleaving the inputted data and outputs the deinterleaved data to the RS parity place holder remover 125.

The RS parity place holder remover 125 removes the 20-byte RS parity place holder (or RS parity data), which was added by the RS parity place holder inserter 121 for the operations of the data interleaver 122 and the data deinterleaver 124. At this point, if systematic RS parity place holders are inserted in the inputted data, the last 20 bytes of the 207 data bytes, which correspond to the RS parity place holders, are removed. Alternatively, if non-systematic RS parity place holders are inserted in the inputted data, the last 20 bytes of the 207 data bytes, which correspond to the RS parity place holders that are inserted to perform non-systematic RS encoding, are removed. The data packet having the RS parity place holders (or RS parity data) removed by the RS parity place holder remover 125 is inputted to the RS encoder 131. The RS encoder 131 performs systematic RS encoding or non-systematic RS encoding on the inputted data packet, so as to add 20 bytes of RS parity data. Thereafter, the processed data packet is outputted to the data interleaver 132.

More specifically, when the inputted data correspond to the main data packet, the RS encoder 131 performs systematic RS encoding. Alternatively, when the inputted data correspond to the enhanced data packet, the RS encoder 131 performs non-systematic RS encoding. Thereafter, the processed data packet is outputted to the data interleaver 132. The data packet having RS parity data added thereto, after being processed with systematic RS encoding or non-systematic RS encoding, is then outputted to the parity replacer 133 and the RS encoder 134. Meanwhile, in order to decide the data outputted from the trellis encoder 135, which is located after the parity replacer 133, as the known data defined in accordance with an agreement between the transmitting system and the receiving system, a memory of the trellis encoder 135 should first be initialized.

At this point, a starting (or beginning) portion of the known data sequence that is being inputted corresponds to the initialization data place holder and not the actual known data. Therefore, a process of generating initialization data for the memory of the trellis encoder is required. More specifically, the initialization data that initialize the input data of the trellis encoder 135 are generated in accordance with a past memory status corresponding to a point immediately before the inputted known data sequence is trellis encoded. Thereafter, the generated trellis memory initialization data replace the corresponding initialization data place holder. This process is required in order to maintain backward compatibility with the conventional receiving system.

Herein, the value of the trellis memory initialization data is decided in accordance with the status of the memory within the trellis encoder 135, so as to generate the initialization data. In addition, due to the replaced trellis memory initialization data, a process of recalculating the RS parity and replacing the RS parity that is outputted from the data interleaver with the recalculated RS parity is also required. Therefore, the RS encoder 134 receives an enhanced data packet including the initialization data place holders, which are to be replaced with the initialization data, from the data interleaver 132, and also receives the trellis memory initialization data from the trellis encoder 135. Then, among the received enhanced data packet, the initialization data place holders are replaced by the initialization data. Subsequently, the RS parity added to the enhanced data packet, having the initialization data replace the initialization data place holders, are removed. Then, the parity-removed enhanced data packet is processed RS encoding so that the RS parity is calculated. Thereafter, the calculated RS parity is outputted to the parity replacer 133. Accordingly, the parity replacer 133 selects the output of the data interleaver 132 as the data within the enhanced data packet and selects the output of the RS encoder 134 as the RS parity. Then, the selected data are outputted to the trellis encoder 135.

If the RS encoder 131 performed non-systematic RS encoding on the enhanced data packet, the RS encoder 134 also performs non-systematic RS encoding. Conversely, if the RS encoder 131 performed systematic RS encoding on the enhanced data packet, the RS encoder 134 also performs systematic RS encoding. Meanwhile, if a main data packet is inputted or if an enhanced data packet, which does not include initialization data place holders that are to be replaced, is inputted, the parity replacer 133 selects the data outputted from the data interleaver 132 and the RS parity, which are directly outputted to the trellis encoder 135 without any modification.

The trellis encoder 135 converts the byte-unit data to symbol units and performs a 12-way interleaving process so as to trellis-encode the received data. Thereafter, the processed data are outputted to the frame multiplexer 136. The frame multiplexer 136 inserts a field synchronization signal and a segment synchronization signal to the data outputted from the trellis encoder 135 and, then, outputs the processed data to the transmitting unit 140. Herein, the transmitting unit 140 includes a pilot inserter 141, a modulator 142, and a radio frequency (RF) up-converter 143. The operations and roles of the transmitting unit 140 and its components are identical to those of the conventional transmitter. Therefore, detailed description of the same will be omitted for simplicity. Meanwhile, when the packet generator 112 multiplexes the enhanced data packet and the main data packet and outputs the multiplexed data, a data group including a plurality of enhanced data packets and the main data packet may be multiplexed and outputted.

In the present invention, the data group may be divided into 3 hierarchical areas: a head area, a body area, and a tail area. More specifically, based on the data group being data-interleaved and outputted, the portion of the data group being outputted first corresponds to the head area, the portion being outputted next corresponds to the body area, and the portion being outputted last corresponds to the tail area. At this point, with respect to the data group after being data-interleaved, the body area may be allocated so that at least a portion or an entire portion of an area having enhanced data, that included in the data group, continuously outputted therefrom. The body area may also be allocated with an area having enhanced data non-continuously outputted therefrom. At this point, the enhanced data packet included in the data group may perform non-systematic RS encoding or systematic RS encoding, as described above.

Figure 6:
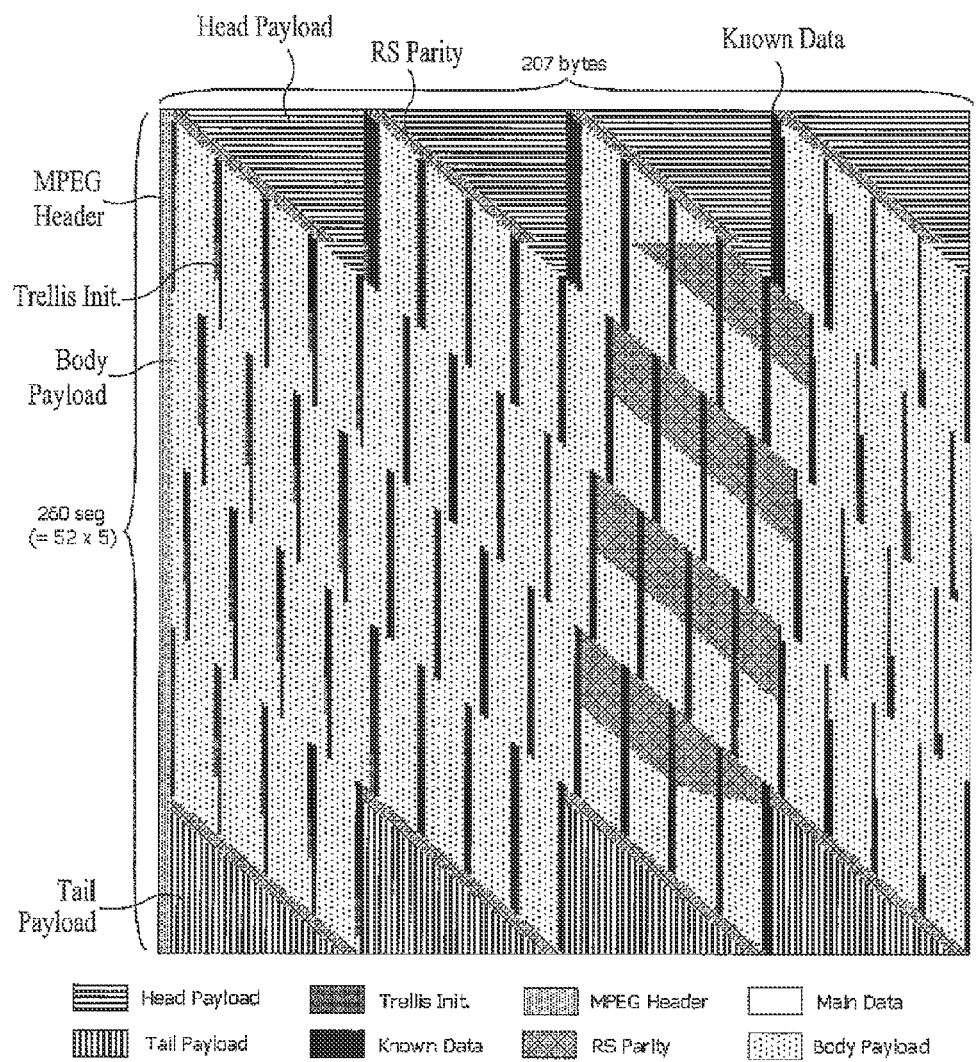
FIG. 6 and FIG. 7 respectively illustrate a data group configuration before and after a data interleaver according to an embodiment of the present invention.
Figure 7:
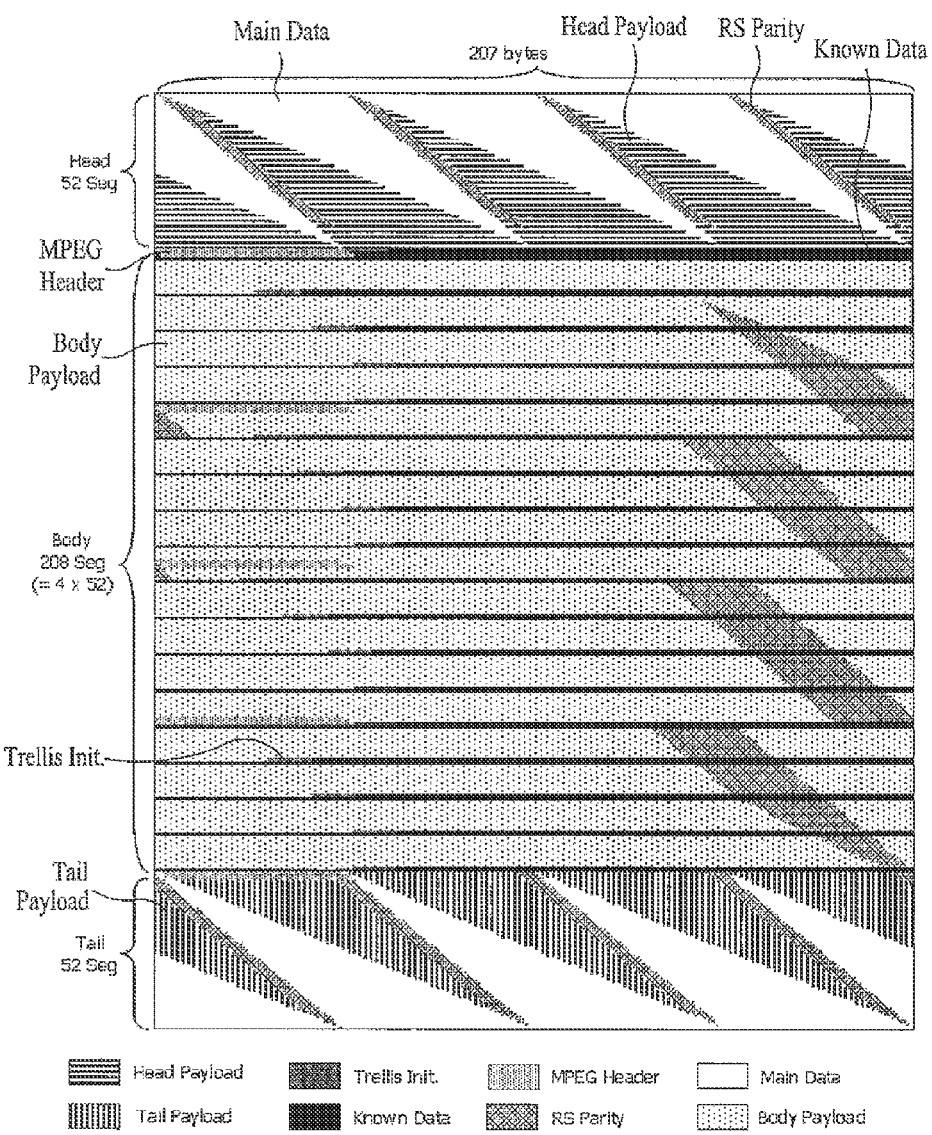

FIG. 6 and FIG. 7 illustrate examples of a data group including 260 first enhanced data packets. More specifically, FIG. 6 illustrates a configuration of the data group prior to data interleaving, and FIG. 7 illustrates a configuration of the data group after data interleaving. In this example, non-systematic RS encoding is performed on the first enhanced data packets. Referring to FIG. 6, with respect to each packet (or segment), the enhanced data, the known data place holders (or known data), the initialization data place holders, and the RS parity place holders (or RS parity) are placed after a 3-byte MPEG header. Since FIG. 6 illustrates a data group structure prior to data interleaving, a 1-byte MPEG synchronization byte is discarded by the data randomizer 113, and 20 bytes of RS parity place holders (or RS parity) are added to the data group. Herein, the positions (or places) of the enhanced data, the pre-defined known data, the initialization data place holders, and the RS parity data may vary depending upon each packet within the data group.

Alternatively, FIG. 7 illustrates a data group structure after data interleaving. Therefore, in dividing the data group into 3 hierarchical areas, the portion being outputted first from the end of the data interleaver corresponds to the head area, the portion being outputted next corresponds to the body area, and the portion being outputted last corresponds to the tail area. Herein, the enhanced data group is divided into 3 different areas so that each area may function and be used differently. More specifically, the body area is allocated with enhanced data only so as to prevent any interference with the main data from occurring, thereby enabling more robust and effective receiving performance. On the other hand, in the head and tail areas, the enhanced data are mixed with the main data in accordance with the output order of the data from the interleaver. Thus, the receiving performance of the head and tail areas may be deteriorated as compared to that of the body area.

Further, if a system inserting known data in the enhanced data group and outputting the known data inserted enhanced data group is used, and when a consecutively long set of known data is to be periodically inserted in the enhanced data, such known data may be inserted in the area where the enhanced data are not mixed with the main data based on the input order of the data interleaver. In other words, known data having a constant pre-determined length may be periodically inserted in the body area, as shown in FIG. 7. However, it is difficult to periodically insert such known data having a constant pre-determined length in the head area and/or the tail area. At this point, initialization data place holders for initializing the memory of the trellis encoder are allocated to the starting (or beginning) portion of the known data sequence.

Figure 8:
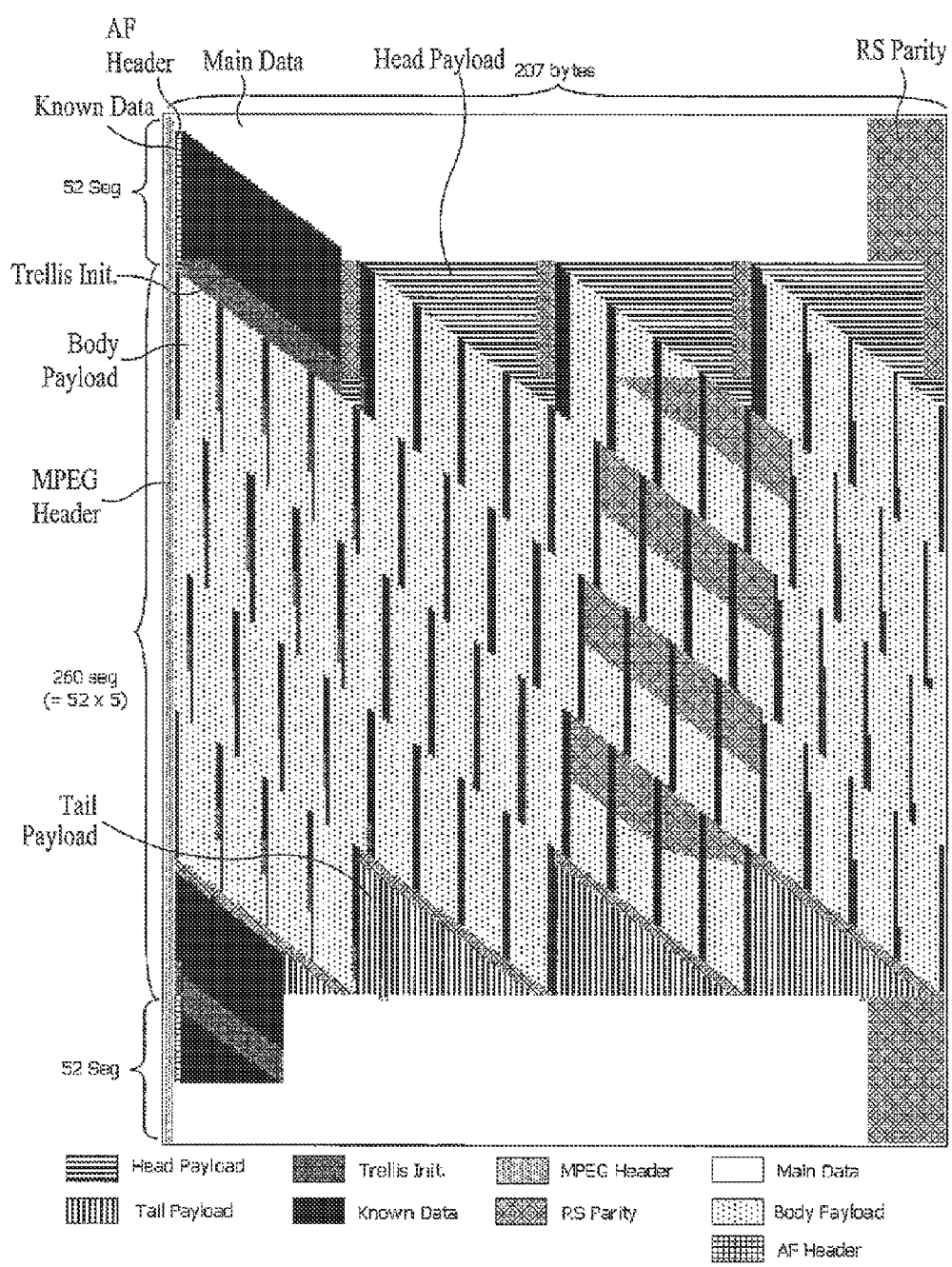
FIG. 8 and FIG. 9 respectively illustrate a data group configuration before and after a data interleaver according to another embodiment of the present invention.
Figure 9:
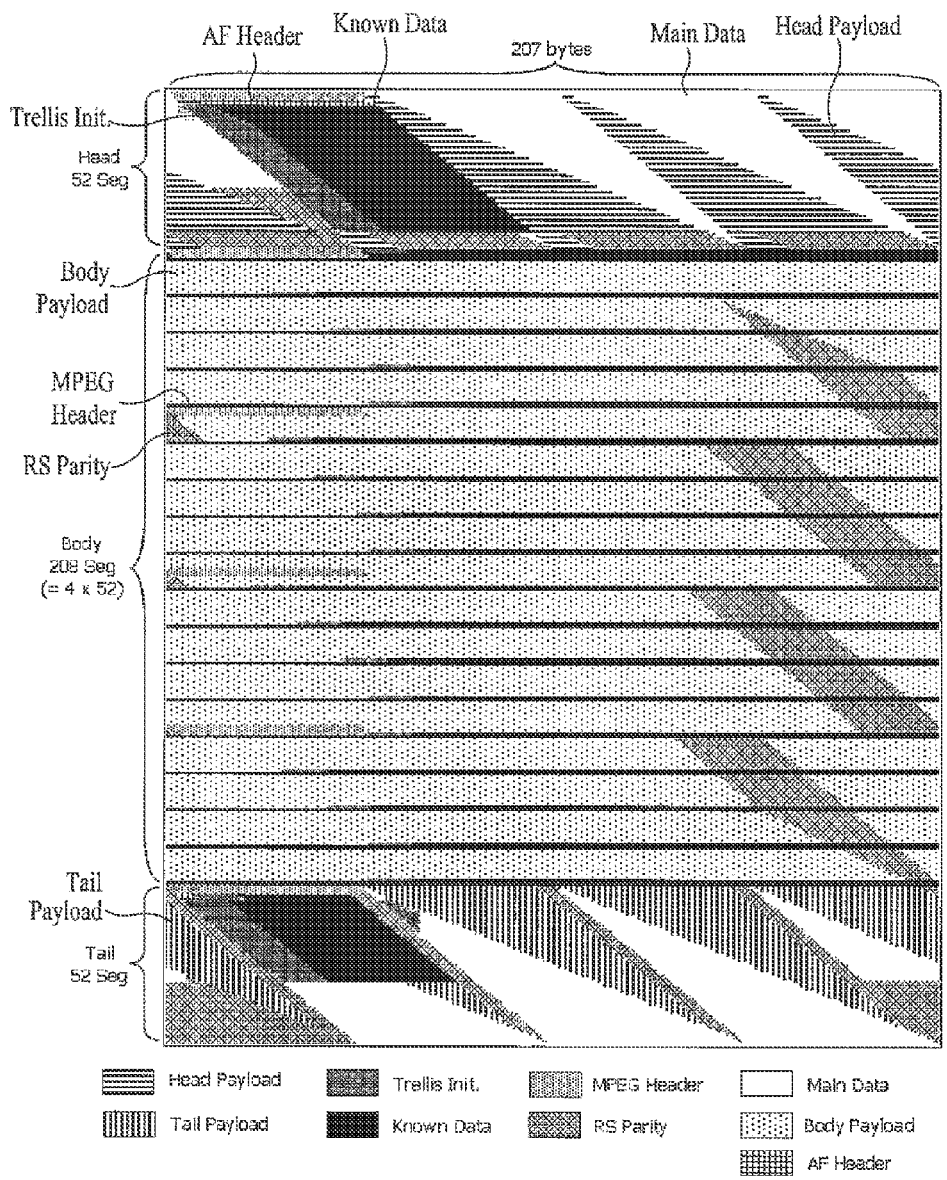

FIG. 8 and FIG. 9 illustrate examples of a data group consisting of 260 data packets including a plurality of first enhanced data packets and a second enhanced data packet. More specifically, FIG. 8 illustrates a configuration of the data group prior to data interleaving, and FIG. 9 illustrates a configuration of the data group after data interleaving. In this example, non-systematic RS encoding is performed on the first enhanced data packets and the second enhanced data packet. Referring to FIG. 8, based on the data packet being inputted to the data interleaves, the data group is broadly divided into areas 401, 402, and 403. Herein, area 401 includes (52-L) main data packets and L number of second enhanced data packets. Area 402 includes only 206 first enhanced data packets. Finally, area 403 includes M number of second enhanced data packets and (52–M) main data packets.

Known data are inserted in the adaptation field within the second enhanced data packets of areas 401 and 403. Herein, the length of the adaptation field in which the known data are inserted in each packet may vary. In addition, when initialization data place holders are required, the initialization data place holders are included in the adaptation field. In the example shown in FIG. 8, the initialization data place holders are not included in area 401, and the initialization data place holders are included in area 403. Referring to FIG. 8, when known data are inserted in the payload area within the first enhanced data area and in the adaptation field within the second enhanced data packet, and then, when data interleaving is performed, the data configuration within the head and tail areas includes known data sequences periodically inserted at short intervals, as shown in FIG. 9.

More specifically, when the data structure of FIG. 8 passes through the data interleaver, the data structure is divided into head, body, and tail areas, as shown in FIG. 9. At this point, the enhanced data are not mixed with the main data in the body area. On the other hand, the enhanced data are mixed with the main data in the head and tail areas. Referring to FIG. 9, long known data sequences are periodically inserted in the body area, and short data sequences are periodically inserted in the head and tail areas. At this point, the known data sequence being inserted in the body area corresponds to the known data sequence inserted in the payload area within the first enhanced data packet and then interleaved. And, the short known data sequence being inserted in the head and tail areas corresponds to the known data sequence inserted in the payload area within the first enhanced data packet and the adaptation field within the second enhanced data packet and then interleaved.

When comparing the data structures shown in FIG. 7 and FIG. 9, it is apparent that known data having relatively the same length are periodically inserted in the head and tail areas. Accordingly, the receiving system may easily receive the data of the head and tail areas by using the known data. Therefore, when the second enhanced data packet is multiplexed at the beginning and end portions of a plurality of consecutive first enhanced data packets, the receiving system may be capable of easily receiving the enhanced data even in an environment with severe channel distortion and frequent change in channels. Particularly, the receiving system may easily receive the enhanced data in the head and tail areas after the interleaving process.

Figure 10:
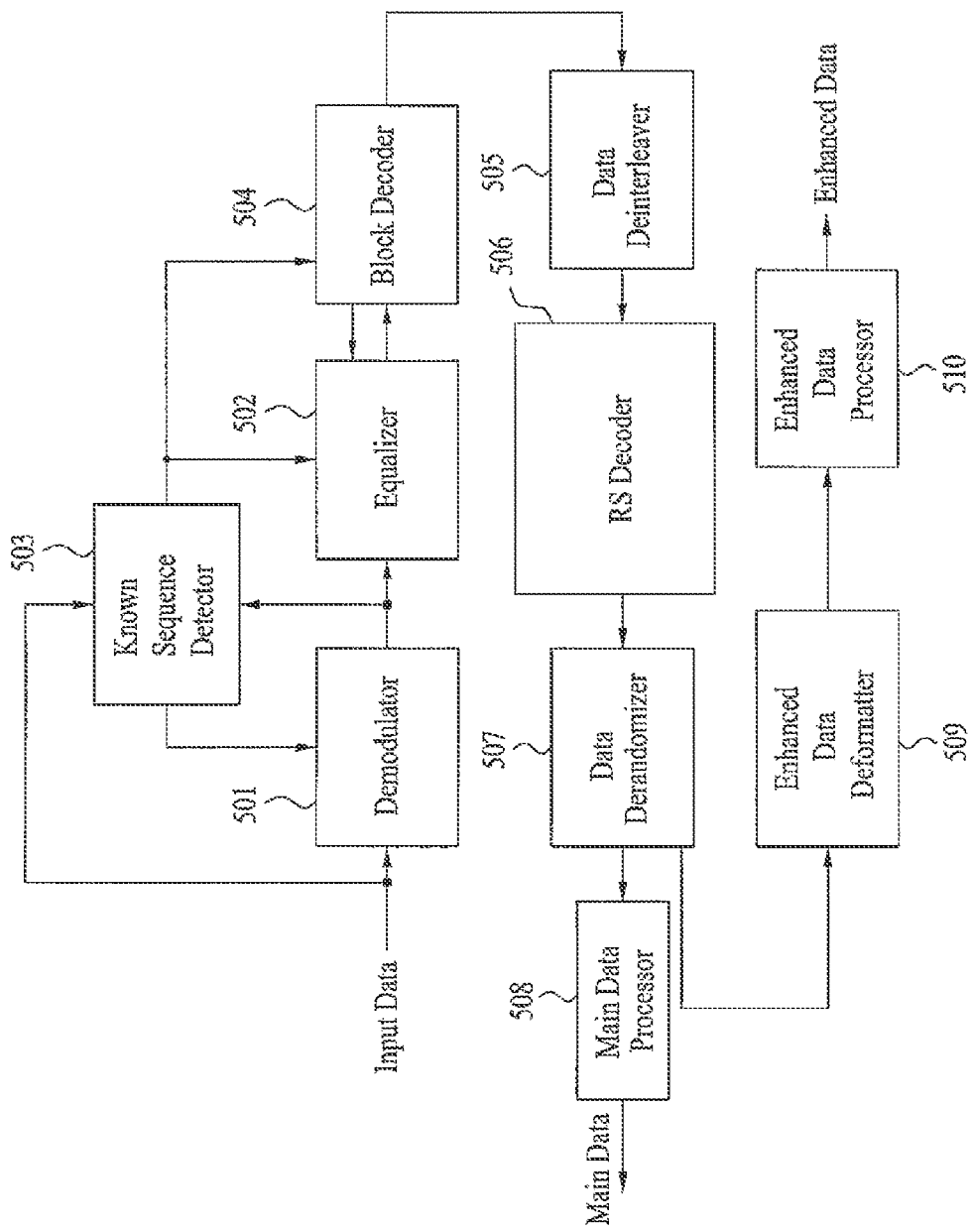
FIG. 10 illustrates a block diagram of a demodulating unit of a digital broadcast receiving system according to an embodiment of the present invention.

FIG. 10 illustrates a block diagram showing a demodulating unit of a digital broadcast receiving system according to an embodiment of the present invention, wherein the demodulating unit is used for receiving data transmitted from the transmitting system, demodulating and equalizing the received data, so as to recover the processed data back to the initial (or original) data. Referring to FIG. 10, the demodulating unit of the digital broadcast receiving system includes a demodulator 501, an equalizer 502, a known sequence detector 503, a block decoder 504, a data deformatter 505, a RS decoder 506, a data deinterleaver 507, a main data processor 508, an enhanced data deformatter 509, and an enhanced data processor 510.

More specifically, an intermediate frequency (IF) signal of a particular channel that is tuned by a tuner is inputted to the demodulator 501 and the known sequence detector 503. The demodulator 501 performs self gain control, carrier recovery, and timing recovery processes on the inputted IF signal, thereby modifying the IF signal to a baseband signal. Then, the demodulator 501 outputs the newly created baseband signal to the equalizer 502 and the known sequence detector 503. The equalizer 502 compensates the distortion of the channel included in the demodulated signal and then outputs the error-compensated signal to the block decoder 504.

At this point, the known sequence detector 503 detects the known sequence place inserted by the transmitting end from the input/output data of the demodulator 501 (i.e., the data prior to the demodulation or the data after the modulation). Thereafter, the place information along with the known data sequence, which is generated from the detected place, is outputted to the demodulator 501, the equalizer 502, and the block decoder 504. Also, the known sequence detector 503 outputs a set of information to the block decoder 504. This set of information is used to allow the block decoder 504 of the receiving system to identify the enhanced data that are processed with additional encoding from the transmitting system and the main data that are not processed with additional encoding. This set of information is also used to indicate a stating point of a block in the enhanced encoder.

The demodulator 501 uses the known data during the timing and/or carrier recovery, thereby enhancing the demodulating performance. Similarly, the equalizer 502 uses the known data sequence, thereby enhancing the equalizing quality. Moreover, the decoding result of the block decoder 504 may be fed-back to the equalizer 502, thereby enhancing the equalizing performance. Meanwhile, if the data that are inputted to the block decoder 504 from the equalizer 502 correspond to the enhanced data being processed with both additional encoding and trellis encoding by the transmitting system, the block decoder 504 performs trellis decoding and additional decoding processes as inverse processes of the transmitting system. Alternatively, if the data that are inputted to the block decoder 504 from the equalizer 502 correspond to the main data being processed only with the trellis encoding process and not the additional encoding process, then only the trellis decoding process is performed. The block decoder 804 considers the RS parity, known data, and MPEG header data as the main data, and performs only the trellis decoding process accordingly.

At this point, if the inputted data correspond to the main data, the block decoder 504 performs Viterbi decoding on the input data, so as to either output a hard decision value or to perform hard decision on a soft decision value and, accordingly, output the hard decided result. Also, if the input data correspond to the enhanced data, the block decoder 504 performs a decoding process on the data encoded by the block processor and the trellis encoder of the transmitting system, so as to output either a hard decision value or a soft decision value. In the transmitting system shown in FIG. 2, a concatenated encoding process is performed on the enhanced data, during which a plurality of error correction codes is used. At this point, an encoder (not shown) within the pre-processor may correspond to an external code, and the data outputted from any one of the block processor 123 and the trellis encoder 135 may correspond to an internal code. Therefore, in order to maximize the coding performance of the external code when decoding such concatenated codes, a soft decision value should be outputted from the decoder of the internal code.

Accordingly, the block decoder 504 may output a hard decision value on the enhanced data. And, if required, it is preferable for the block decoder 504 to output a soft decision value. More specifically, depending upon the system design or conditions, the block decoder 504 outputs any one of the soft decision value and the hard decision value with respect to the enhanced data, and the block decoder 504 outputs the hard decision value with respect to the main data, known data, RS parity, and MPEG header.

The output of the block decoder 504 is inputted to the data deinterleaver 505. The data deinterleaver 505 performs an inverse process of the data interleaver included in the transmitting system. Then, the data deinterleaver 505 outputs the deinterleaved data to the RS decoder 506. If the received packet corresponds to a main data packet, the RS decoder 506 performs systematic RS decoding. If the received packet corresponds to an enhanced data packet, the RS decoder 506 performs either systematic RS decoding or non-systematic RS decoding. More specifically, if the transmitting system performed systematic RS encoding on the enhanced data packet, the RS decoder 506 performs systematic RS decoding on the received packet. On the other hand, if the transmitting system performed non-systematic RS encoding on the enhanced data packet, the RS decoder 506 performs non-systematic RS decoding on the received packet. The data packet being processed with RS decoding by the RS decoder 506 and having the RS parity bytes removed therefrom, is inputted to the data derandomizer 507.

The derandomizer 507 generates a pseudo random data byte identical to that of the randomizer included in the digital broadcast transmitting system (or DTV transmitter). Thereafter, the derandomizer 507 performs a bitwise exclusive OR (XOR) operation between the generated pseudo random data byte and the data packet data packet outputted from the RS decoder 506, thereby inserting the MPEG synchronization bytes to the beginning of each packet so as to output the data in 188-byte packet units. The output of the data derandomizer 507 is inputted to the main data processor 508 and to the enhanced data deformatter 509 at the same time. At this point, it is difficult to perform a bitwise exclusive OR (XOR) operation between the soft decision value of the enhanced data and the pseudo random bit. Therefore, as described above, depending upon the code of the soft decision value, a hard decision is performed on the data that ate to be outputted to the main data processor 508. Then, an XOR operation is performed between the pseudo random bit and the hard decided data, which are then outputted. More specifically, if the code of the soft decision value is a positive number, the hard decision value is equal to '1'. And, if the code of the soft decision value is a negative number, the hard decision value is equal to '0'. Thereafter, an XOR operation is performed between the pseudo random bit and any one of the hard decided values.

The main data processor 508 performs decoding only on the main data packet corresponding to the main MPEG. Herein, if the inputted data packet corresponds to a first enhanced data packet, the PID within the first enhanced data packet corresponds to a PID that is not used by the conventional receiving system, a null PID, or a reserved PID. Accordingly, the main data processor 508 discards the first enhanced data packet instead of decoding it. Additionally, if the inputted data packet corresponds to a second enhanced data packet, the main data processor 508 considers the enhanced data and/or known data inserted in the adaptation field as the stuff byte. Accordingly, the main data processor 508 discards the second enhanced data packet instead of decoding it. Thus, the main data processor 508 may only perform the decoding process only on the main data packet. Eventually, this also indicates that the conventional receiving system also discards each of the first and second enhanced data packets without decoding it.

A soft decision is required in the enhanced data processor 510 in order to enhance the performance when decoding the error correction code. Therefore, the data derandomizer 507 creates a separate output data with respect to the enhanced data, which is then outputted to the enhanced data deformatter 509. For example, when the pseudo random bit is equal to '1', the data deformatter 805 changes the code of the soft decision value and then outputs the changed code. On the other hand, if the pseudo random bit is equal to '0', the data deformatter 805 outputs the soft decision value without any change in the code.

As described above, if the pseudo random bit is equal to '1', the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR 1=1 and 1 XOR 0=0). More specifically, if the pseudo random bit generated from the data derandomizer 507 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

If the inputted data correspond to the main data packet, the enhanced data deformatter 509 does not output the inputted data to the enhanced data processor 510. In addition, if the inputted data correspond to the first enhanced data packet, the enhanced data deformatter 509 removes the MPEG header bytes and the known data, which are included in the first enhanced data packet. Then, the enhanced data deformatter 509 outputs the processed data to the enhanced data processor 510. Furthermore, if the inputted data correspond to the second enhanced data packet, the enhanced data deformatter 509 removes the MPEG header bytes, the known data, the adaptation field header, and the main data, which are included in the second enhanced data packet. Then, the enhanced data deformatter 509 outputs the processed data to the enhanced data processor 510. In accordance with an inverse process of the pre-processor 111 included in the transmitting system, the enhanced data processor 510 removes the null data bytes, which were inserted during the byte expansion process. Then, the enhanced data processor 510 further processes the input data with deinterleaving and error correction decoding. Thereafter, the enhanced data processor 510 outputs the processed data.

Figure 11:
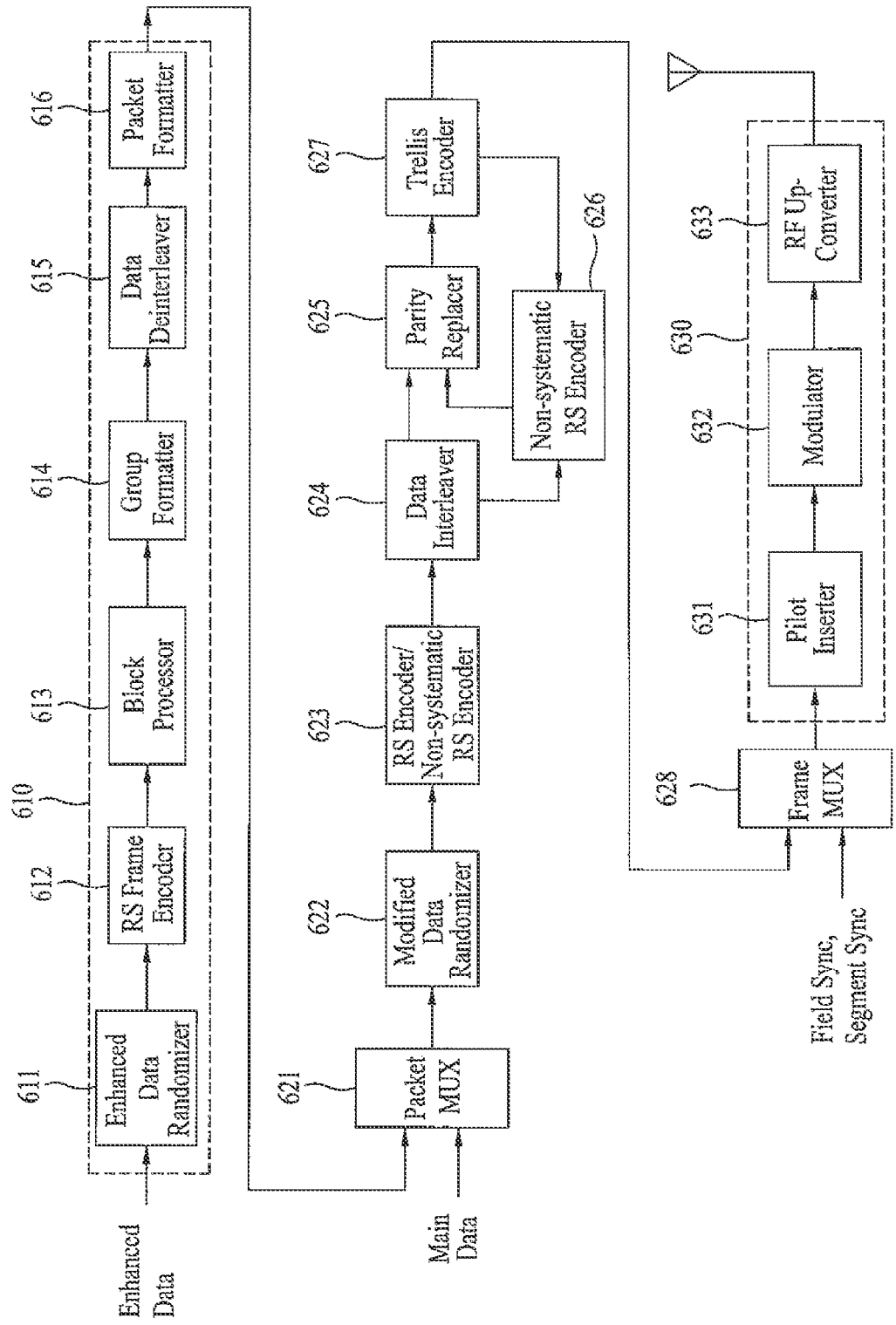
FIG. 11 illustrates a block diagram of a digital broadcast transmitting system according to another embodiment of the present invention.

FIG. 11 illustrates a block diagram showing the structure of a digital broadcast transmitting system according to an embodiment of the present invention. The digital broadcast (or DTV) transmitting system includes a pre-processor 610, a packet multiplexer 621, a data randomizer 622, a Reed-Solomon (RS) encoder/non-systematic RS encoder 623, a data interleaver 624, a parity byte replacer 625, a non-systematic RS encoder 626, a frame multiplexer 628, and a transmitting unit 630. The pre-processor 610 includes an enhanced data randomizer 611, a RS frame encoder 612, a block processor 613, a group formatter 614, a data deinterleaver 615, and a packet formatter 616.

In the present invention having the above-described structure, main data are inputted to the packet multiplexer 621. Enhanced data are inputted to the enhanced data randomizer 611 of the pre-processor 610, wherein an additional coding process is performed so that the present invention can respond swiftly and appropriately against noise and change in channel. The enhanced data randomizer 611 randomizes the received enhanced data and outputs the randomized enhanced data to the RS frame encoder 612. At this point, by having the enhanced data randomizer 611 perform the randomizing process on the enhanced data, the randomizing process on the enhanced data by the data randomizer 622 in a later process may be omitted. Either the randomizer of the conventional broadcast system may be used as the randomizer for randomizing the enhanced data, or any other type of randomizer may be used herein.

The RS frame encoder 612 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 612 also includes a process of mixing in row units many sets of enhanced data each having a pre-determined size. By performing an error correction coding process on the inputted enhanced data, the RS frame encoder 612 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 612 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 612 is inputted to the block processor 613. The block processor 613 codes the RS-coded and CRC-coded enhanced data at a coding rate of M1/N1. Then, the block processor 613 outputs the M1/N1-rate coded enhanced data to the group formatter 614. In order to do so, the block processor 613 identifies the block data bytes being inputted from the RS frame encoder 612 as bits.

The block processor 613 may receive supplemental information data such as signaling information, which include information on the system, and identifies the supplemental information data bytes as data bits. Herein, the supplemental information data, such as the signaling information, may equally pass through the enhanced data randomizer 611 and the RS frame encoder 612 so as to be inputted to the block processor 613. Alternatively, the supplemental information data may be directly inputted to the block processor 613 without passing through the enhanced data randomizer 611 and the RS frame encoder 612. The signaling information corresponds to information required for receiving and processing data included in the data group in the receiving system. Such signaling information includes data group information, multiplexing information, and burst information.

As a M1/N1-rate encoder, the block processor 613 codes the inputted data at a coding rate of M1/N1 and then outputs the M1/N1-rate coded data. For example, if 1 bit of the input data is coded to 2 bits and outputted, then M1 is equal to 1 and N1 is equal to 2 (i.e., M1=1 and N1=2). Alternatively, if 1 bit of the input data is coded to 4 bits and outputted, then M1 is equal to 1 and N1 is equal to 4 (i.e., M1=1 and N1=4). As an example of the present invention, it is assumed that the block processor 613 performs a coding process at a coding rate of 1/2 (also referred to as a 1/2-rate coding process) or a coding process at a coding rate of 1/4 (also referred to as a 1/4-rate coding process). More specifically, the block processor 613 codes the received enhanced data and supplemental information data, such as the signaling information, at either a coding rate of 1/2 or a coding rate of 1/4. Thereafter, the supplemental information data, such as the signaling information, are identified and processed as enhanced data.

Since the 1/4-rate coding process has a higher coding rate than the 1/2-rate coding process, greater error correction ability may be provided. Therefore, in a later process, by allocating the 1/4-rate coded data in an area with deficient receiving performance within the group formatter 614, and by allocating the 1/2-rate coded data in an area with excellent receiving performance, the difference in the overall performance may be reduced. More specifically, in case of performing the 1/2-rate coding process, the block processor 613 receives 1 bit and codes the received 1 bit to bits (i.e., 1 symbol). Then, the block processor 613 outputs the processed 2 bits (or 1 symbol). On the other hand, in case of performing the 1/4-rate coding process, the block processor 613 receives 1 bit and codes the received 1 bit to 4 bits (i.e., 2 symbols). Then, the block processor 613 outputs the processed 4 bits (or 2 symbols). Additionally, the block processor 613 performs a block interleaving process in symbol units on the symbol-coded data. Subsequently, the block processor 613 converts to bytes the data symbols that are block-interleaved and have the order rearranged.

The group formatter 614 inserts the enhanced data outputted from the block processor 613 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each data group may be configured to include a field synchronization signal.

In another example given in the present invention, a data group is divided into A, B, and C regions in a data configuration prior to data deinterleaving.

Figure 12:
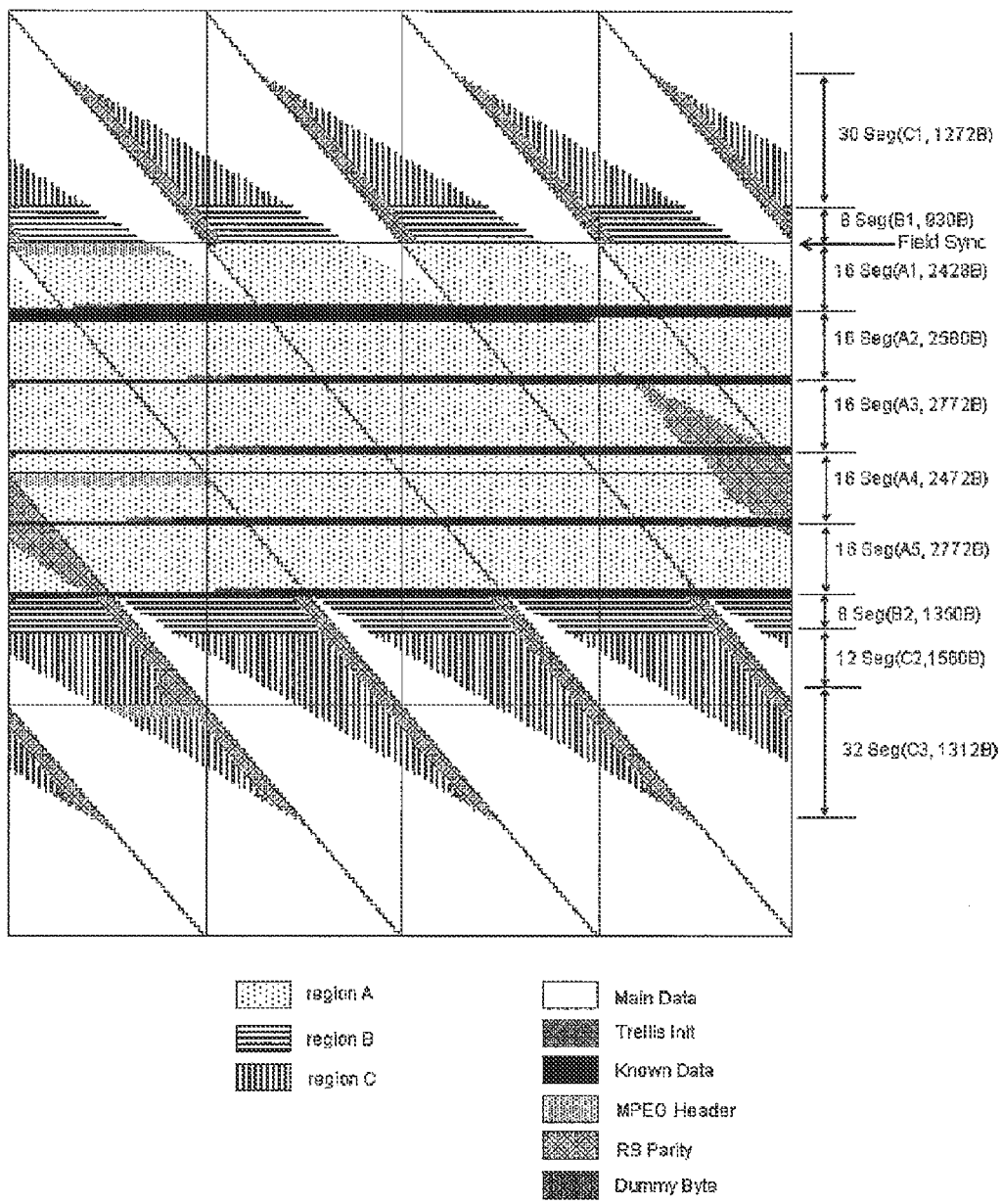
FIG. 12 and FIG. 13 illustrate another examples of data configuration at before and after ends of a data deinterleaver in a transmitting system according to the present invention.
Figure 13:
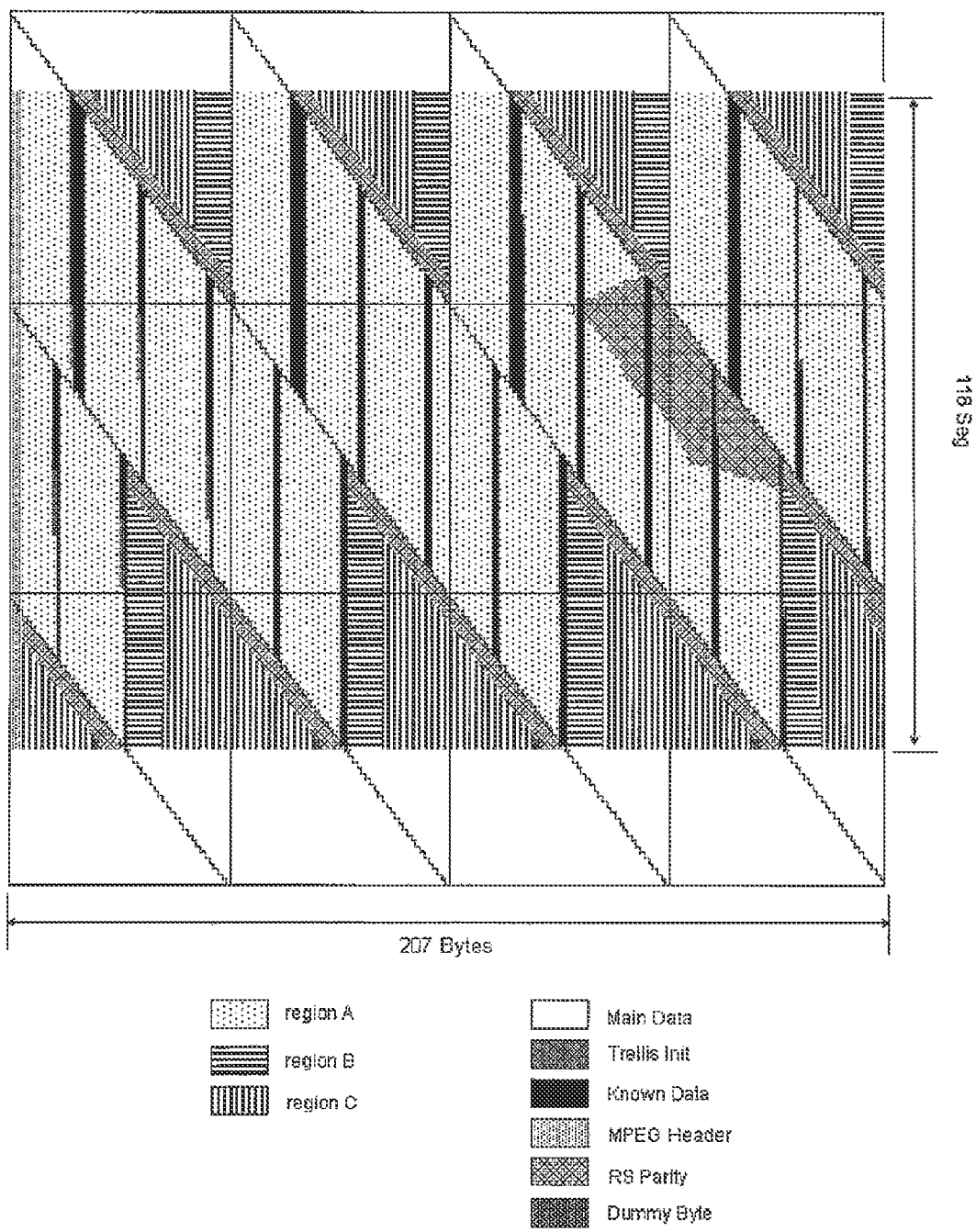

FIG. 12 illustrates an alignment of data before being data deinterleaved and identified, and FIG. 13 illustrates an alignment of data after being data deinterleaved and identified. More specifically, a data structure identical to that shown in FIG. 12 is transmitted to a receiving system. Also, the data group configured to have the same structure as the data structure shown in FIG. 12 is inputted to the data deinterleaver 615.

As described above, FIG. 12 illustrates a data structure prior to data deinterleaving that is divided into 3 regions, such as region A, region B, and region C. Also, in the present invention, each of the regions A to C is further divided into a plurality of regions. Referring to FIG. 12, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of enhanced data, which are inputted, may also vary depending upon the characteristic of each region.

In the example of the present invention, the data structure is divided into regions A to C based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region A). However, due to interference from the main data, it is difficult to periodically insert known data and also to insert consecutively long known data to a region having interference from the main data (e.g., region B and region C).

Hereinafter, examples of allocating data to region A (A1 to A5), region B (B1 and B2), and region C (C1 to C3) will now be described in detail with reference to FIG. 12. The data group size, the number of hierarchically divided regions within the data group and the size of each region, and the number of enhanced data bytes that can be inserted in each hierarchically divided region of FIG. 12 are merely examples given to facilitate the understanding of the present invention. Herein, the group formatter 614 creates a data group including places in which field synchronization bytes are to be inserted, so as to create the data group that will hereinafter be described in detail.

More specifically, region A is a region within the data group in which a long known data sequence may be periodically inserted, and in which includes regions wherein the main data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 12, 2428 bytes of the enhanced data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the enhanced data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 630 bytes of the enhanced data may be inserted in the region B1, and 1350 bytes may be inserted in region B2. Similarly, trellis initialization data or known data, MPEG header, and RS parity are not included in the enhanced data. In case of region B, the receiving system may perform equalization by using channel information obtained from the field synchronization section. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the enhanced data may be inserted in the region C1, 1560 bytes may be inserted in region C2, and 1312 bytes may be inserted in region C3. Similarly, trellis initialization data or known data, MPEG header, and RS parity are not included in the enhanced data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 613 may encode the enhanced data, which are to be inserted to each region based upon the characteristic of each hierarchical region, at a different coding rate. For example, the block processor 613 may encode the enhanced data, which are to be inserted in regions A1 to A5 of region A, at a coding rate of 1/2. Then, the group formatter 614 may insert the 1/2-rate encoded enhanced data to regions A1 to A5.

The block processor 613 may encode the enhanced data, which are to be inserted in regions B1 and B2 of region B, at a coding rate of 1/4 having higher error correction ability as compared to the 1/2-coding rate. Then, the group formatter 614 inserts the 1/4-rate coded enhanced data in region B1 and region B2. Furthermore, the block processor 613 may encode the enhanced data, which are to be inserted in regions C1 to C3 of region C, at a coding rate of 1/4 or a coding rate having higher error correction ability than the 1/4-coding rate. Then, the group formatter 614 may either insert the encoded enhanced data to regions C1 to C3, as described above, or leave the data in a reserved region for future usage.

In addition, the group formatter 614 also inserts supplemental data, such as signaling information that notifies the overall transmission information, other than the enhanced data in the data group. Also, apart from the encoded enhanced data outputted from the block processor 613, the group formatter 614 also inserts MPEG header place holders, non-systematic RS parity place holders, main data place holders, which are related to data deinterleaving in a later process, as shown in FIG. 12. Herein, the main data place holders are inserted because the enhanced data bytes and the main data bytes are alternately mixed with one another in regions B and C based upon the input of the data deinterleaver, as shown in FIG. 12. For example, based upon the data outputted after data deinterleaving, the place holder for the MPEG header may be allocated at the very beginning of each packet.

Furthermore, the group formatter 614 either inserts known data generated in accordance with a pre-determined method or inserts known data place holders for inserting the known data in a later process. Additionally, place holders for initializing the trellis encoder 627 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders), MPEG header place holders, and RS parity place holders.

The output of the group formatter 614 is inputted to the data deinterleaver 615. And, the data deinterleaver 615 deinterleaves data by performing an inverse process of the data interleaver on the data and place holders within the data group, which are then outputted to the packet formatter 616. More specifically, when the data and place holders within the data group configured, as shown in FIG. 12, are deinterleaved by the data deinterleaver 615, the data group being outputted to the packet formatter 616 is configured to have the structure shown in FIG. 13.

Among the data deinterleaved and inputted, the packet formatter 616 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 614 inserts the known data place holder, the packet formatter 616 may either insert actual known data in the known data place holder or output the known data place holder without any change or modification for a replacement insertion in a later process. Afterwards, the packet formatter 616 divides the data within the above-described packet-formatted data group into 188-byte unit enhanced data packets (i.e., MPEG TS packets), which are then provided to the packet multiplexer 621. The packet multiplexer 621 multiplexes the 188-byte unit enhanced data packet and main data packet outputted from the packet formatter 616 according to a pre-defined multiplexing method. Subsequently, the multiplexed data packets are outputted to the data randomizer 622. The multiplexing method may be modified or altered in accordance with diverse variables of the system design.

As an example of the multiplexing method of the packet multiplexer 621, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 622 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 623. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 623. This is because the randomizing process has already been performed on the enhanced data by the enhanced data randomizer 611 in an earlier process. Herein, a data randomizing process may or may not be performed on the known data (or known data place holder) and the initialization data place holder included in the enhanced data packet.

The RS encoder/non-systematic RS encoder 623 RS-codes the data randomized by the data randomizer 622 or the data bypassing the data randomizer 622. Then, the RS encoder/non-systematic RS encoder 623 adds a 20-byte RS parity to the coded data, thereby outputting the RS-parity-added data to the data interleaver 624. At this point, if the inputted data correspond to the main data packet, the RS encoder/non-systematic RS encoder 623 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 624 corresponds to a byte unit convolutional interleaver. The output of the data interleaver 624 is inputted to the parity byte replacer 625 and the non-systematic RS encoder 626.

Meanwhile, a memory within the trellis encoding module 627, which is positioned after the parity byte replacer 625, should first be initialized in order to allow the output data of the trellis encoding module 627 so as to become the known data defined based upon an agreement between the receiving system and the transmitting system. More specifically, the memory of the trellis encoding module 627 should first be initialized before the known data sequence being inputted is trellis-encoded. At this point, the beginning of the known data sequence that is inputted corresponds to the initialization data place holder inserted by the group formatter 614 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 627, thereby generating the trellis memory initialization data accordingly. Due to the influence of the replace initialization data, a process of recalculating the RS parity, thereby replacing the RS parity outputted from the trellis encoding module 627 with the newly calculated RS parity is required. Accordingly, the non-systematic RS encoder 626 receives the enhanced data packet including the initialization data place holder that is to be replaced with the initialization data from the data interleaver 624 and also receives the initialization data from the trellis encoding module 627. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 625. Accordingly, the parity byte replacer 625 selects the output of the data interleaver 624 as the data within the enhanced data packet, and selects the output of the non-systematic RS encoder 626 as the RS parity. Thereafter, the parity byte replacer 625 outputs the selected data.

Meanwhile, if the main data packet is inputted, or if the enhanced data packet that does not include the initialization data place holder that is to be replaced, the parity byte replacer 625 selects the data and RS parity outputted from the data interleaver 624 and directly outputs the selected data to the trellis encoding module 627 without modification. The trellis encoding module 627 converts the byte-unit data to symbol-unit data and 12-way interleaves and trellis-encodes the converted data, which are then outputted to the frame multiplexer 628. The frame multiplexer 628 inserts field synchronization and segment synchronization signals in the output of the trellis encoding module 627 and then outputs the processed data to the transmitting unit 630. Herein, the transmitting unit 630 includes a pilot inserter 631, a modulator 632, and a radio frequency (RF) up-converter 633. The operation of the transmitting unit 630 is identical to the conventional transmitting systems. Therefore, a detailed description of the same will be omitted for simplicity.

Figure 14:
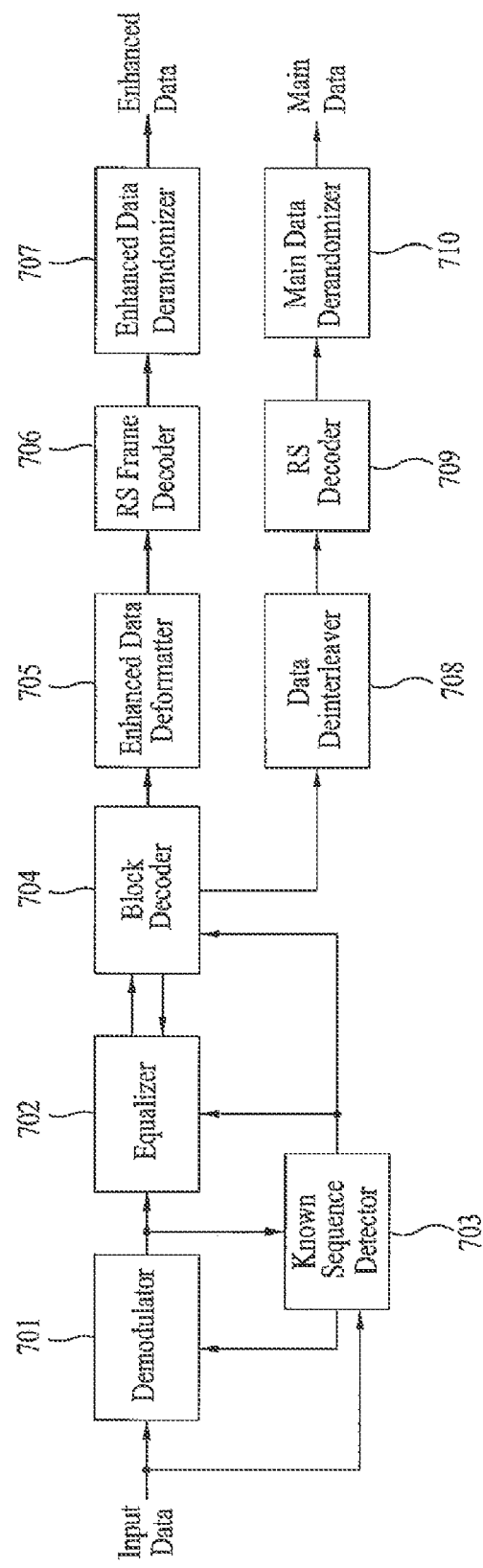
FIG. 14 illustrates a block diagram of a demodulating unit of a receiving system according to another embodiment of the present invention.

FIG. 14 illustrates a block diagram of a demodulating unit included in the receiving system according to another embodiment of the present invention. Herein, the demodulating unit may effectively process signals transmitted from the transmitting system shown in FIG. 11. Referring to FIG. 14, the demodulating unit includes a demodulator 701, a channel equalizer 702, a known data detector 703, a block decoder 704, an enhanced data deformatter 705, a RS frame decoder 706, an enhanced data derandomizer 707, a data deinterleaver 708, a RS decoder 709, and a main data derandomizer 710. For simplicity, the demodulator 701, the channel equalizer 702, the known data detector 703, the block decoder 704, the enhanced data deformatter 705, the RS frame decoder 706, and the enhanced data derandomizer 707 will be referred to as an enhanced data processor. And, the data deinterleaver 708, the RS decoder 709, and the main data derandomizer 710 will be referred to as a main data processor.

More specifically, the enhanced data including known data and the main data are received through the tuner and inputted to the demodulator 701 and the known data detector 703. The demodulator 701 performs automatic gain control, carrier recovery, and timing recovery on the data that are being inputted, thereby creating baseband data, which are then outputted to the equalizer 702 and the known data detector 703. The equalizer 702 compensates the distortion within the channel included in the demodulated data. Then, the equalizer 702 outputs the compensated data to the block decoder 704.

At this point, the known data detector 703 detects the known data place inserted by the transmitting system to the input/output data of the demodulator 701 (i.e., data prior to demodulation or data after demodulation). Then, along with the position information, the known data detector 703 outputs the symbol sequence of the known data generated from the corresponding position to the demodulator 701 and the equalizer 702. Additionally, the known data detector 703 outputs information enabling the block decoder 704 to identify the enhanced data being additionally encoded by the transmitting system and the main data that are not additionally encoded to the block decoder 704. Furthermore, although the connection is not shown in FIG. 14, the information detected by the known data detector 703 may be used in the overall receiving system and may also be used in the enhanced data formatter 705 and the RS frame decoder 706.

By using the known data symbol sequence when performing the timing recovery or carrier recovery, the demodulating performance of the demodulator 701 may be enhanced. Similarly, by using the known data, the channel equalizing performance of the channel equalizer 702 may be enhanced. Furthermore, by feeding-back the decoding result of the block decoder 704 to the channel equalizer 702, the channel equalizing performance may also be enhanced.

The channel equalizer 702 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 12. More specifically, in the example of the present invention, each region A, B, and C are further divided into regions A1 to A5, regions B1 and B2, and regions C1 to C3, respectively. Referring to FIG. 12, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions 32, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 704 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 704 correspond to the main data on which additional encoding is not performed and only trellis-encoding is performed by the transmitting system, only the trellis-decoding process is performed. The data group decoded by the block decoder 704 is inputted to the enhanced data deformatter 705, and the main data packet is inputted to the data deinterleaver 708.

More specifically, if the inputted data correspond to the main data, the block decoder 704 performs Viterbi decoding on the inputted data, so as to either output a hard decision value or hard-decide a soft decision value and output the hard-decided result. On the other hand, if the inputted correspond to the enhanced data, the block decoder 704 outputs either a hard decision value or a soft decision value on the inputted enhanced data. In other words, if the data inputted to the block decoder 704 correspond to the enhanced data, the block decoder 704 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 704 may output a hard decision value on the enhanced data. However, when required, it is more preferable that the block decoder 704 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 708, the RS decoder 709, and the main data derandomizer 710 are blocks required for receiving the main data. These blocks may not be required in a receiving system structure that receives only the enhanced data. The data deinterleaver 70B performs an inverse process of the data interleaver of the transmitting system. More specifically, the data deinterleaver 708 deinterleaves the main data being outputted from the block decode 704 and outputs the deinterleaved data to the RS decoder 709. The RS decoder 709 performs systematic RS decoding on the deinterleaved data and outputs the systematically decoded data to the main data derandomizer 710. The main data derandomizer 710 receives the data outputted from the RS decoder 709 so as to generate the same pseudo random byte as that of the randomizer in the transmitting system. The main data derandomizer 710 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 705 from the block decoder 704 is a data group format. At this point, the enhanced data deformatter 705 already knows the structure of the input data. Therefore, the enhanced data deformatter 705 identifies the system information including signaling information and the enhanced data from the data group. Thereafter, the identified signaling information is transmitted to where the system information is required, and the enhanced data are outputted to the RS frame decoder 706. The enhanced data deformatter 705 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 706.

More specifically, the RS frame decoder 706 receives the RS-coded and CRC-coded enhanced data from the enhanced data deformatter 705 so as to configure the RS frame. The RS frame decoder 706 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 707. Herein, the enhanced data derandomizer 707 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 706 may also be configured as follows. The RS frame decoder 706 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 706 compares the absolute value of the soft decision value obtained from the block decoder 704 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 15:
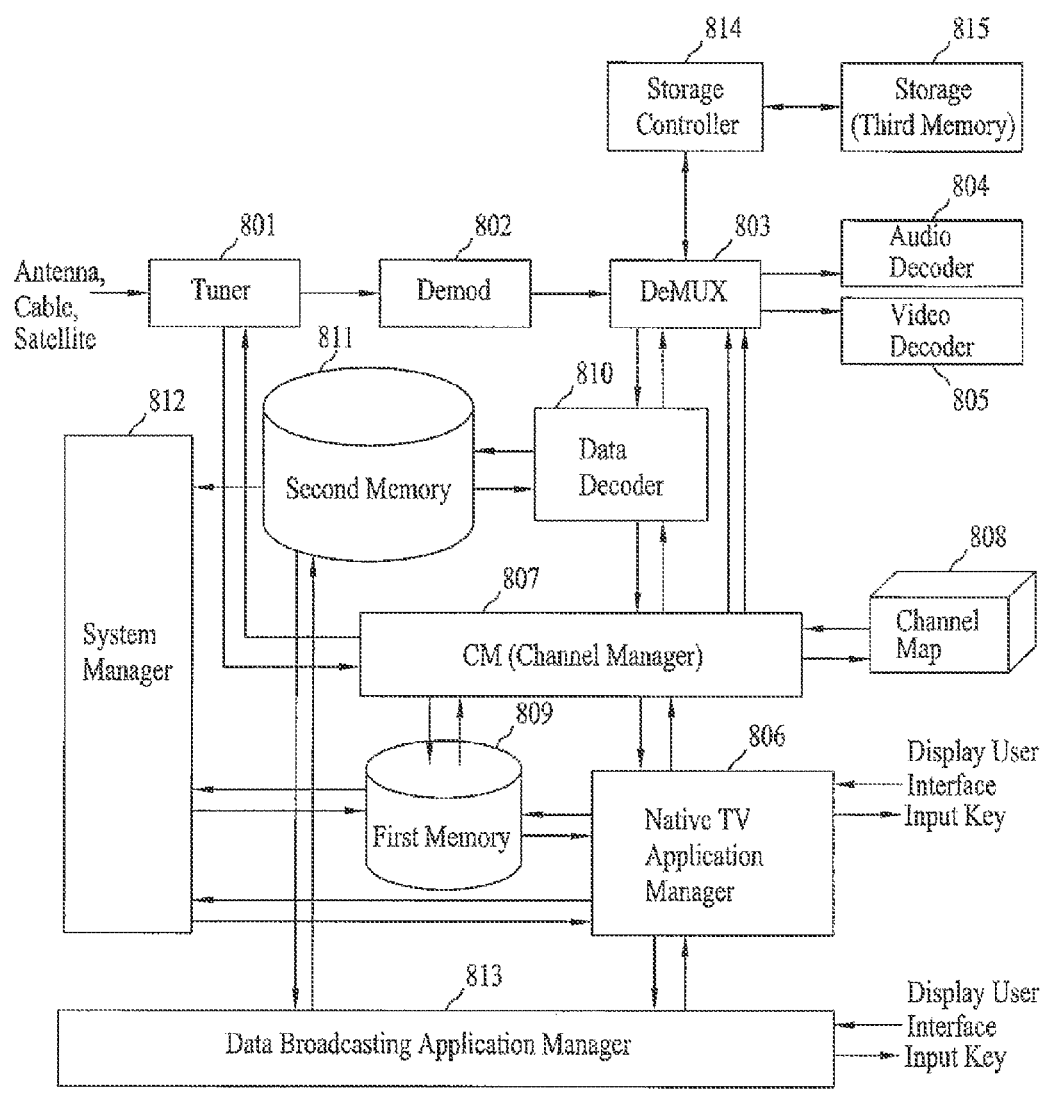
FIG. 15 illustrates a block diagram of a receiving system according to an embodiment of the present invention.

FIG. 15 illustrates a block diagram showing the structure of a digital broadcast receiving system according to an embodiment of the present invention. Referring to FIG. 15, the digital broadcast receiving system includes a tuner 801, a demodulating unit 802, a demultiplexer 803, an audio decoder 804, a video decoder 805, a native TV application manager 806, a channel manager 807, a channel map 808, a first memory 809, a data decoder 810, a second memory 811, a system manager 812, a data broadcasting application manager 813, a storage controller 814, and a third memory 815. Herein, the third memory 815 is a mass storage device, such as a hard disk drive (HDD) or a memory chip. The tuner 801 tunes a frequency of a specific channel through any one of an antenna, cable, and satellite. Then, the tuner 801 down-converts the tuned frequency to an intermediate frequency (IF), which is then outputted to the demodulating unit 802. At this point, the tuner 801 is controlled by the channel manager 807. Additionally, the result and strength of the broadcast signal of the tuned channel are also reported to the channel manager 807. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 802 performs demodulation and channel equalization on the signal being outputted from the tuner 801, thereby identifying the main data and the enhanced data. Thereafter, the identified main data and enhanced data are outputted in TS packet units. Examples of the demodulating unit 802 are shown in FIG. 10 and FIG. 14. The demodulating unit shown in FIG. 10 and FIG. 14 is merely exemplary and the scope of the present invention is not limited to the examples set forth herein. In the embodiment given as an example of the present invention, only the enhanced data packet outputted from the demodulating unit 802 is inputted to the demultiplexer 803. In this case, the main data packet is inputted to another demultiplexer (not shown) that processes main data packets. Herein, the storage controller 814 is also connected to the other demultiplexer in order to store the main data after processing the main data packets. The demultiplexer of the present invention may also be designed to process both enhanced data packets and main data packets in a single demultiplexer.

The storage controller 814 is interfaced with the demultiplexer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 15, the corresponding enhanced data and/or main data that are inputted to the demultiplexer are stored in the third memory 815 in accordance with the control of the storage controller 814. The third memory 815 may be described as a temporary storage area and/or a permanent storage area. Herein, the temporary storage area is used for the time shifting function, and the permanent storage area is used for a permanent storage of data according to the user's choice (or decision).

When the data stored in the third memory 815 need to be reproduced (or played), the storage controller 814 reads the corresponding data stored in the third memory 815 and outputs the read data to the corresponding demultiplexer (e.g., the enhanced data are outputted to the demultiplexer 803 shown in FIG. 15). At this point, according to the embodiment of the present invention, since the storage capacity of the third memory 815 is limited, the compression encoded enhanced data and/or main data that are being inputted are directly stored in the third memory 815 without any modification for the efficiency of the storage capacity. In this case, depending upon the reproduction (or reading) command, the data read from the third memory 815 pass trough the demultiplexer so as to be inputted to the corresponding decoder, thereby being restored to the initial state.

The storage controller 814 may control the reproduction (or play), fast-forward, rewind, slow motion, instant replay functions of the data that are already stored in the third memory 815 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 814 compression encodes the inputted data and stored the compression-encoded data to the third memory 815. In order to do so, the storage controller 814 may include an encoder, wherein the encoder may be embodied as one of software, middleware, and hardware. Herein, an MPEG encoder may be used as the encoder according to an embodiment of the present invention. The encoder may also be provided outside of the storage controller 814.

Meanwhile, in order to prevent illegal duplication (or copies) of the input data being stored in the third memory 815, the storage controller 814 scrambles the input data and stores the scrambled data in the third memory 815. Accordingly, the storage controller 814 may include a scramble algorithm for scrambling the data stored in the third memory 815 and a descramble algorithm for descrambling the data read from the third memory 815. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 803 receives the real-time data outputted from the demodulating unit 802 or the data read from the third memory 815 and demultiplexes the received data. In the example given in the present invention, the demultiplexer 803 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 803 and the subsequent elements.

The demultiplexer 803 demultiplexes enhanced data and program specific information/program and system information protocol (PSI/PSIP) tables from the enhanced data packet inputted in accordance with the control of the data decoder 810. Thereafter, the demultiplexed enhanced data and PSI/PSIP tables are outputted to the data decoder 810 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (FES) type or to a section type. More specifically, either the FES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 810, the demultiplexer 803 performs section filtering, thereby discarding repetitive sections and outputting only the non-repetitive sections to the data decoder 810. The demultiplexer 803 may also output only the sections configuring desired tables (e.g., VCT) to the data decoder 810 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 803 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 803 may output only an application information table (AIT) to the data decoder B10 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 811 by the data decoder 810.

The data decoder 810 parses the DSM-CC section configuring the demultiplexed enhanced data. Then, the enhanced data corresponding to the parsed result are stored as a database in the second memory 811. The data decoder 810 groups a plurality of sections having the same table identification (table_id) so as to configure a table, which is then parsed. Thereafter, the parsed result is stored as a database in the second memory 811. At this point, by parsing data and/or sections, the data decoder 810 reads all of the remaining actual section data that are not section-filtered by the demultiplexer 803. Then, the data decoder 810 stores the read data to the second memory 811. The second memory 811 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 811 or be outputted to the data broadcasting application manager 813. In addition, reference may be made to the application identification information, service component identification information, and service information in order to decode the data service data. Alternatively, such information may also prepare the operation of the application program for the data service. Furthermore, the data decoder 810 controls the demultiplexing of the system information table, which corresponds to the information table associated with the channel and events. Thereafter, an A.V PID list may be transmitted to the channel manager 807.

The channel manager 807 may refer to the channel map 808 in order to transmit a request for receiving system-related information data to the data decoder 810, thereby receiving the corresponding result. In addition, the channel manager 807 may also control the channel tuning of the tuner 801. Furthermore, the channel manager 807 may directly control the demultiplexer 803, so as to set up the A/V PID, thereby controlling the audio decoder 804 and the video decoder 805. The audio decoder 804 and the video decoder 805 may respectively decode and output the audio data and video data demultiplexed from the main data packet. Alternatively, the audio decoder 804 and the video decoder 805 may respectively decode and output the audio data and video data demultiplexed from the enhanced data packet. Meanwhile, when the enhanced data include data service data, and also audio data and video data, it is apparent that the audio data and video data demultiplexed by the demultiplexer 803 are respectively decoded by the audio decoder 804 and the video decoder 805. For example, an audio-coding (AC)-3 decoding algorithm may be applied to the audio decoder 804, and a MPEG-2 decoding algorithm may be applied to the video decoder 805.

Meanwhile, the native TV application manager 806 operates a native application program stored in the first memory 809, thereby performing general functions such as channel change. The native application program refers to software stored in the receiving system upon shipping of the product. More specifically, when a user request (or command) is transmitted to the receiving system through a user interface (UI), the native TV application manger 806 displays the user request on a screen through a graphic user interface (GUI), thereby responding to the user's request. The user interface receives the user request through an input device, such as a remote controller, a key pad, a jog controller, an a touchscreen provided on the screen, and then outputs the received user request to the native TV application manager 806 and the data broadcasting application manager 813. Furthermore, the native TV application manager 806 controls the channel manager 807, thereby controlling channel-associated, such as the management of the channel map 808, and controlling the data decoder 810. The native TV application manager 806 also controls the GUI of the overall receiving system, thereby storing the user request and status of the receiving system in the first memory 809 and restoring the stored information.

The channel manager 807 controls the tuner 801 and the data decoder 810, so as to managing the channel map 808 so that it can respond to the channel request made by the user. More specifically, channel manager 807 sends a request to the data decoder 810 so that the tables associated with the channels that are to be tuned are parsed. The results of the parsed tables are reported to the channel manager 807 by the data decoder 810. Thereafter, based on the parsed results, the channel manager 807 updates the channel map 808 and sets up a PID in the demultiplexer 803 for demultiplexing the tables associated with the data service data from the enhanced data.

The system manager 812 controls the booting of the receiving system by turning the power on or off. Then, the system manager 812 stores ROM images (including downloaded software images) in the first memory 809. More specifically, the first memory 809 stores management programs such as operating system (OS) programs required for managing the receiving system and also application program executing data service functions. The application program is a program processing the data service data stored in the second memory 811 so as to provide the user with the data service. If the data service data are stored in the second memory 811, the corresponding data service data are processed by the above-described application program or by other application programs, thereby being provided to the user. The management program and application program stored in the first memory 809 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 809 upon the shipping of the receiving system, or be stored in the first 809 after being downloaded. The application program for the data service (i.e., the data service providing application program) stored in the first memory 809 may also be deleted, updated, and corrected. Furthermore, the data service providing application program may be downloaded and executed along with the data service data each time the data service data are being received.

When a data service request is transmitted through the user interface, the data broadcasting application manager 813 operates the corresponding application program stored in the first memory 809 so as to process the requested data, thereby providing the user with the requested data service. And, in order to provide such data service, the data broadcasting application manager 813 supports the graphic user interface (GUI). Herein, the data service may be provided in the form of text (or short message service (SMS)), voice message, still image, and moving image. The data broadcasting application manager 813 may be provided with a platform for executing the application program stored in the first memory 809. The platform may be, for example, a Java virtual machine for executing the Java program. Hereinafter, an example of the data broadcasting application manager 813 executing the data service providing application program stored in the first memory 809, so as to process the data service data stored in the second memory 811, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 15, the GPS module receives satellite signals transmitted from a plurality of low earth orbit satellites and extracts the current position (or location) information (e.g., longitude, latitude, altitude), thereby outputting the extracted information to the data broadcasting application manager 813.

At this point, it is assumed that the electronic map including information on each link and nod and other diverse graphic information are stored in one of the second memory 811, the first memory 809, and another memory that is not shown. More specifically, according to the request made by the data broadcasting application manager 813, the data service data stored in the second memory 811 are read and inputted to the data broadcasting application manager 813. The data broadcasting application manager 813 translates (or deciphers) the data service data read from the second memory 811, thereby extracting the necessary information according to the contents of the message and/or a control signal.

Figure 16:
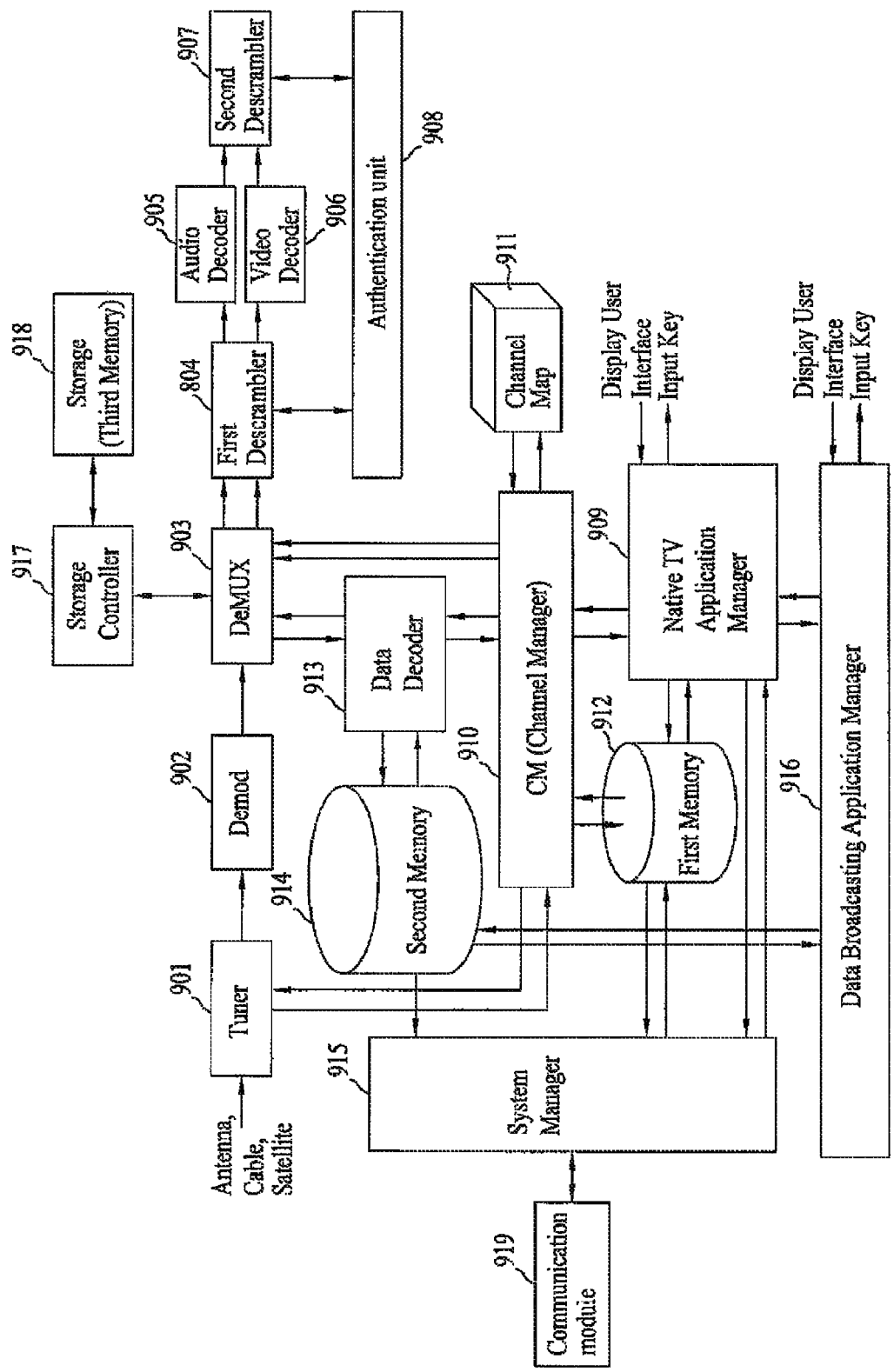
FIG. 16 illustrates a block diagram of a receiving system according to another embodiment of the present invention.

FIG. 16 illustrates a block diagram showing the structure of a digital broadcast (or television) receiving system according to another embodiment of the present invention. Referring to FIG. 16, the digital broadcast receiving system includes a tuner 901, a demodulating unit 902, a demultiplexer 903, a first descrambler 904, an audio decoder 905, a video decoder 906, a second descrambler 907, an authentication unit 908, a native TV application manager 909, a channel manager 910, a channel map 911, a first memory 912, a data decoder 913, a second memory 914, a system manager 915, a data broadcasting application manager 916, a storage controller 917, a third memory 918, and a telecommunication module 919. Herein, the third memory 918 is a mass storage device, such as a hard disk drive (HDD) or a memory chip. Also, during the description of the digital broadcast (or television or DTV) receiving system shown in FIG. 16, the components that are identical to those of the digital broadcast receiving system of FIG. 15 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 904 and 907, and the authentication means will be referred to as an authentication unit 908. Such naming of the corresponding components is merely exemplary and is not limited to the terms suggested in the description of the present invention. For example, the units may also be referred to as a decryptor. Although FIG. 16 illustrates an example of the descramblers 904 and 907 and the authentication unit 908 being provided inside the receiving system, each of the descramblers 904 and 907 and the authentication unit 908 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 908, the scrambled broadcasting contents are descrambled by the descramblers 904 and 907, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 908 and the descramblers 904 and 907 will now be described in detail. The receiving system receives the scrambled broadcasting contents through the tuner 901 and the demodulating unit 902. Then, the system manager 915 decides whether the received broadcasting contents have been scrambled. Herein, the demodulating unit 902 may be included as a demodulating means according to embodiments of the present invention as described in FIG. 10 and FIG. 14. However, the present invention is not limited to the examples given in the description set forth herein. If the system manager 915 decides that the received broadcasting contents have been scrambled, then the system manager 915 controls the system to operate the authentication unit 908. As described above, the authentication unit 908 performs an authentication process in order to decide whether the receiving system according to the present invention corresponds to a legitimate host entitled to receive the paid broadcasting service. Herein, the authentication process may vary in accordance with the authentication methods.

For example, the authentication unit 908 may perform the authentication process by comparing an IP address of an IP datagram within the received broadcasting contents with a specific address of a corresponding host. At this point, the specific address of the corresponding receiving system (or host) may be a MAC address. More specifically, the authentication unit 908 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 908 performs the authentication process by determining the conformity between the address of the corresponding receiving system and the system information of the receiving system that is mapped with the IP address. In other words, if the authentication unit 908 determines that the two types of information conform to one another, then the authentication unit 908 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 908 of the receiving system extracts the identification information of the receiving system and the identification information included in the EMM of the broadcasting service that is being received. Then, the authentication unit 908 determines whether the identification information conform to each other, so as to perform the authentication process. More specifically, if the authentication unit 908 determines that the information conform to each other, then the authentication unit 908 eventually determines that the receiving system is entitled to receive the request broadcasting service.

In yet another example, the authentication unit 908 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 915 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 915 transmits the payment information to the remote transmitting system through the telecommunication module 919.

The authentication unit 908 authenticates the corresponding receiving system and/or the external module. Then, if the authentication process is successfully completed, the authentication unit 908 certifies the corresponding receiving system and/or the external module as a legitimate system and/or module entitled to receive the requested paid broadcasting service. In addition, the authentication unit 908 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 908, the receiving system may descramble the scrambled broadcasting contents received from the transmitting system. At this point, the descrambling process is performed by the first and second descramblers 904 and 907. Herein, the first and second descramblers 904 and 907 may be included in an internal module or an external module of the receiving system.

The receiving system is also provided with a common interface for communicating with the external module including the first and second descramblers 904 and 907, so as to perform the descrambling process. More specifically, the first and second descramblers 904 and 907 may be included in the module or in the receiving system in the form of hardware, middleware or software. Herein, the descramblers 904 and 907 may be included in any one of or both of the module and the receiving system. If the first and second descramblers 904 and 907 are provided inside the receiving system, it is advantageous to have the transmitting system (i.e., at least any one of a service provider and a broadcast station) scramble the corresponding data using the same scrambling method.

Alternatively, if the first and second descramblers 904 and 907 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 915, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advance is inserted in the receiving system, the receiving system receives and loads the CAS software from the memory card so as to perform the authentication process. In this example, the CAS software is read out from the memory card and stored in the first memory 912 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 908 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 908 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 915, then the memory card is verified and determined to be a normal memory card that may be used in the receiving system. At this point, the CAS software may either be installed in the first memory 912 upon the shipping of the present invention, or be downloaded to the first memory 912 from the transmitting system or the module or memory card, as described above. Herein, the descrambling function may be operated by the data broadcasting application manger 916 as an application program.

Thereafter, the CAS software parses the EMM/ECM packets outputted from the demultiplexer 903, so as to verify whether the receiving system is entitled to receive the corresponding data, thereby obtaining the information required for descrambling (i.e., the CW) and providing the obtained CW to the descramblers 904 and 907. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 904 and 907. Each of the descramblers 904 and 907 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 904 and 907 may be included in the module either in the form of hardware or in the form of software. In this case, the scrambled data that being received are descrambled by the module and then demodulated. Also, if the scrambled data that are being received are stored in the third memory 918, the received data may be descrambled and then stored, or stored in the memory at the point of being received and then descrambled later on prior to being played (or reproduced). Thereafter, in case scramble/descramble algorithms are provided in the storage controller 917, the storage controller 917 scrambles the data that are being received once again and then stores the re-scrambled data to the third memory 918.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 919. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 919 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 919 may also be configured. Also, the PDU may be configured in the Java application of the receiving system and then outputted to the telecommunication module 919. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 919.

The broadcasting data being transmitted and received through the above-described wireless data network may include data required for performing the function of limiting data reception. Meanwhile, the demultiplexer 903 receives either the real-time data outputted from the demodulating unit 902 or the data read from the third memory 918, thereby performing demultiplexing. In this embodiment of the present invention, the demultiplexer 903 performs demultiplexing on the enhanced data packet. Similar process steps have already been described earlier in the description of the present invention. Therefore, a detailed of the process of demultiplexing the enhanced data will be omitted for simplicity.

The first descrambler 904 receives the demultiplexed signals from the demultiplexer 903 and then descrambles the received signals. At this point, the first descrambler 904 may receive the authentication result received from the authentication unit 908 and other data required for the descrambling process, so as to perform the descrambling process. The audio decoder 905 and the video decoder 906 receive the signals descrambled by the first descrambler 904, which are then decoded and outputted. Alternatively, if the first descrambler 904 did not perform the descrambling process, then the audio decoder 905 and the video decoder 906 directly decode and output the received signals. In this case, the decoded signals are received and then descrambled by the second descrambler 907 and processed accordingly.

As described above, the DTV transmitting system and receiving system and method of processing television signal according to the present invention have the following advantages. More specifically, in the present invention, enhanced data are processed with additional encoding. Also, in the present invention, additional data, such as the processed enhanced data and/or known data, are inserted into a payload area within a plurality of transport stream (TS) packets and, then, the processed data are transmitted in the form of a first enhanced data packet. Alternatively, the TS packets are inserted into an adaptation field, and the processed data are then transmitted in the form of a second enhanced data packet. Accordingly, the digital broadcasting system and the data processing method according to the present invention is highly protected against (or resistant to) any error that may occur when transmitting supplemental data through a channel.

And, the present invention is also highly compatible to the conventional receiving system. Moreover, the present invention may also receive the supplemental data without any error even in channels having severe ghost effect and noise. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) receiving system for processing digital broadcast data, the DTV receiving system comprising:
a tuner for receiving a broadcast signal comprising a data group, the data group having first and second data regions, the first data region including a plurality of data segments, the second data region including a plurality of data segments, the first data region having enhanced data, known data sequences, and signaling information, and the second data region having main data and enhanced data, wherein a total number of enhanced data bytes in an ith segment in the second data region is different from a total number of enhanced data bytes in an (i+1)th segment in the second data region;
a demodulator for demodulating the broadcast signal;
an equalizer for compensating channel distortion of the broadcast signal using the known data sequences;
a first decoder for first decoding the channel-distortion-compensated broadcast signal; and
a second decoder for second decoding the first-decoded broadcast signal.

2. The DTV receiving system of claim 1, wherein at least two of the known data sequences are spaced 16 segments apart.

3. The DTV receiving system of claim 1, wherein the equalizer compensates channel distortion of the enhanced data in the first data region by interpolating at least two channel impulse responses (CIRs) estimated using the known data sequences.

4. The DTV receiving system of claim 1, wherein the equalizer compensates channel distortion of the enhanced data in the second data region by extrapolating at least two CIRs estimated using the known data sequences.

5. A method of processing digital broadcast data in a DTV receiving system, the method comprising:
receiving, by a tuner, a broadcast signal comprising a data group, the data group having first and second data regions, the first data region including a plurality of data segments, the second data region including a plurality of data segments, the first data region having enhanced data, known data sequences, and signaling information, and the second data region having main data and enhanced data, wherein a total number of enhanced data bytes in an ith segment in the second data region is different from a total number of enhanced data bytes in an (i+1)th segment in the second data region;
demodulating, by a demodulator, the broadcast signal;
compensating, by an equalizer, channel distortion of the broadcast signal using the known data sequences;
first decoding, by a first decoder, the channel-distortion-compensated broadcast signal; and
second decoding, by a second decoder, the first-decoded broadcast signal.

6. The method of claim 5, wherein at least two of the known data sequences are spaced 16 segments apart.

7. The method of claim 5, wherein compensating channel distortion of the broadcast signal compensates channel distortion of the enhanced data in the first data region by interpolating at least two channel impulse responses (CIRs) estimated using the known data sequences.

8. The method of claim 5, wherein compensating channel distortion of the broadcast signal compensates channel distortion of the enhanced data in the second data region by extrapolating at least two CIRs estimated using the known data sequences.

* * * * *